United States Patent
Lassalle-Balier et al.

(10) Patent No.: US 10,921,373 B2
(45) Date of Patent: Feb. 16, 2021

(54) MAGNETIC FIELD SENSOR ABLE TO IDENTIFY AN ERROR CONDITION

(71) Applicant: Allegro MicroSystems, LLC, Worcester, MA (US)

(72) Inventors: Rémy Lassalle-Balier, Bures sur Yvette (FR); Jeffrey Eagen, Manchester, NH (US); Paul A. David, Bow, NH (US)

(73) Assignee: Allegro MicroSystems, LLC, Manchester, NH (US)

( * ) Notice: Subject to any disclaimer, the term of this patent is extended or adjusted under 35 U.S.C. 154(b) by 389 days.

(21) Appl. No.: 15/825,879

(22) Filed: Nov. 29, 2017

(65) Prior Publication Data
US 2019/0162784 A1    May 30, 2019

(51) Int. Cl.
| | |
|---|---|
| *G01R 31/319* | (2006.01) |
| *G01R 33/09* | (2006.01) |
| *G01D 5/14* | (2006.01) |
| *G01D 18/00* | (2006.01) |

(52) U.S. Cl.
CPC ....... *G01R 31/31901* (2013.01); *G01D 5/145* (2013.01); *G01D 18/00* (2013.01); *G01R 33/09* (2013.01); *G01R 33/093* (2013.01)

(58) Field of Classification Search
CPC ........ G06N 3/00; G05B 1/00; G05B 2219/00; G06F 1/00; G06F 2101/00
See application file for complete search history.

(56) References Cited

U.S. PATENT DOCUMENTS

| | | |
|---|---|---|
| 7,365,530 B2 | 4/2008 | Bailey et al. |
| 7,592,801 B2 | 9/2009 | Bailey et al. |
| 7,622,914 B2 | 11/2009 | Bailey et al. |
| 7,772,838 B2 | 8/2010 | Bailey et al. |
| 7,777,607 B2 | 8/2010 | Taylor et al. |

(Continued)

FOREIGN PATENT DOCUMENTS

| | | |
|---|---|---|
| EP | 1503184 | 7/2004 |
| EP | 1503184 | 2/2005 |

(Continued)

OTHER PUBLICATIONS

PCT Search Report and Written Opinion dated Oct. 16, 2018 for PCT Appl. No. PCT/US2018/055986; 18 pages.

(Continued)

*Primary Examiner* — Jermele M Hollington
*Assistant Examiner* — Temilade S Rhodes-Vivour
(74) *Attorney, Agent, or Firm* — Daly, Crowley, Mofford & Durkee, LLP

(57) ABSTRACT

A method of determining an error condition in a magnetic field sensor can include receiving a first bridge signal, the first bridge signal generated by a first full bridge circuit. The method can also include receiving a second bridge signal, the second bridge signal generated by a second full bridge circuit. The method can also include determining a bridge separation from the first bridge signal and the second bridge signal. The method can also include comparing a function of the bridge separation to a threshold value. The method can also include generating an error signal indicative of the error condition or not indicative of the error condition in response to the comparing.

41 Claims, 13 Drawing Sheets

(56) References Cited

U.S. PATENT DOCUMENTS

| | | | |
|---|---|---|---|
| 8,450,996 B2 | 5/2013 | Foletto et al. | |
| 8,723,512 B1 | 5/2014 | Burdette et al. | |
| 9,506,996 B2 | 11/2016 | Granig et al. | |
| 2009/0102464 A1* | 4/2009 | Doogue | G01R 33/093 324/207.21 |
| 2015/0108971 A1* | 4/2015 | Granig | G01R 33/091 324/252 |
| 2015/0236876 A1* | 8/2015 | Cadugan | H04L 25/03834 375/242 |
| 2016/0163965 A1* | 6/2016 | Han | H01L 43/08 257/467 |
| 2016/0245677 A1 | 8/2016 | Cosgrave et al. | |
| 2016/0282500 A1* | 9/2016 | Filippenko | G01V 3/104 |
| 2017/0131426 A1* | 5/2017 | Sgarz | G01V 8/005 |

FOREIGN PATENT DOCUMENTS

| | | |
|---|---|---|
| EP | 1849683 | 4/2007 |
| EP | 1849683 | 10/2007 |

OTHER PUBLICATIONS

PCT Search Report and Written Opinion dated Feb. 4, 2019 for PCT Appl. No. PCT/US2018/055986; 18 pages.

Response to communication pursuant to rule 161(1) and 162 EPC filed on Oct. 2, 2020 for European Application No. 18803812.9; 29 pages.

International Preliminary Report on Patentability dated Jun. 11, 2020 for PCT Appl. No. PCT/US2018/055986; 11 pages.

* cited by examiner

MAGNETIC FIELD SENSOR ABLE TO IDENTIFY AN ERROR CONDITION

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to magnetic field sensors and, more particularly, to magnetic field sensors that have magnetoresistance elements and that can identify an error condition resulting from large external magnetic fields.

BACKGROUND

As used herein, the term "magnetic field sensing element" is used to describe a variety of electronic elements that can sense a magnetic field. One such magnetic field sensing element is a magnetoresistance (MR) element. The magnetoresistance element has a resistance that changes in relation to a magnetic field experienced by the magnetoresistance element.

As is known, there are different types of magnetoresistance elements, for example, a semiconductor magnetoresistance element such as Indium Antimonide (InSb), a giant magnetoresistance (GMR) element, an anisotropic magnetoresistance element (AMR), and a tunneling magnetoresistance (TMR) element, also called a magnetic tunnel junction (MTJ) element.

Of these magnetoresistance elements, the GMR and the TMR elements operate with spin electronics (i.e., electron spins) where the resistance is related to the magnetic orientation of different magnetic layers separated by nonmagnetic layers. In spin valve configurations, the resistance is related to an angular direction of a magnetization in a so-called "free-layer" relative to another layer so-called "reference layer." The free layer and the reference layer are described more fully below.

The magnetoresistances element may be used as a single element or, alternatively, may be used as two or more magnetoresistance elements arranged in various configurations, e.g., a half bridge or full (Wheatstone) bridge.

As used herein, the term "magnetic field sensor" is used to describe a circuit that uses one or more magnetic field sensing elements, generally in combination with other circuits. In a typical magnetic field sensor, the magnetic field sensing element and the other circuits can be integrated upon a common substrate, for example, a semiconductor substrate. In some embodiments, the magnetic field sensor can also include a lead frame and packaging.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

Various parameters characterize the performance of magnetic field sensors and magnetic field sensing elements. With regard to magnetic field sensing elements, the parameters include sensitivity, which is the change in the output signal of a magnetic field sensing element in response to a magnetic field, and linearity, which is the degree to which the output signal of a magnetic field sensor varies linearly (i.e., in direct proportion) to the magnetic field. The parameters also include offset, which describes and output from the magnetic field sensing element that is not indicative of zero magnetic field when the magnetic field sensor experiences a zero magnetic field. The parameters also include common mode rejection, which describes a change in behavior when the magnetic field sensor experiences a large (common mode) external magnetic field.

GMR and TMR elements are known to have a relatively high sensitivity, compared, for example, to Hall effect elements. TMR elements are known to have a higher sensitivity than GMR elements, but at the expense of higher noise at low frequencies.

Both GMR and TMR elements (magnetoresistance elements) are known to suffer from saturation at magnetic fields above a threshold level. Thus, at saturation levels of external magnetic field, an output signal from a magnetoresistance element is not reliable.

Thus, it would be desirable to provide a magnetic field sensor that uses magnetoresistance elements, and that can identify an error condition when one or more of the magnetoresistance elements are in saturation.

SUMMARY

The present invention provides a magnetic field sensor that uses magnetoresistance elements, and that can identify an error condition when one or more of the magnetoresistance elements are in saturation.

In accordance with an example useful for understanding an aspect of the present invention, a method of determining an error condition in a magnetic field sensor can include receiving a first bridge signal, the first bridge signal generated by a first full bridge circuit. The method can also include receiving a second bridge signal, the second bridge signal generated by a second full bridge circuit. The method can also include determining a bridge separation from the first bridge signal and the second bridge signal. The method can also include comparing a function of the bridge separation to a threshold value. The method can also include generating an error signal indicative of the error condition or not indicative of the error condition in response to the comparing.

In accordance with another example useful for understanding another aspect of the present invention, a magnetic field sensor can include one or more circuit modules configured to:

receive a first bridge signal, the first bridge signal generated by a first full bridge circuit;

receive a second bridge signal, the second bridge signal generated by a second full bridge circuit;

determine a bridge separation from the first bridge signal and the second bridge signal;

compare a function of the bridge separation to a threshold value; and generate an error signal indicative or an error or indicative of no error in response to the comparing.

In accordance with another example useful for understanding another aspect of the present invention, a magnetic field sensor can include means for receiving a first bridge signal, the first bridge signal generated by a first full bridge circuit. The magnetic field sensor can also include means for receiving a second bridge signal, the second bridge signal generated by a second full bridge circuit. The magnetic field sensor can also include means for determining a bridge separation from the first bridge signal and the second bridge signal. The magnetic field sensor can also include means for comparing a function of the bridge separation to a threshold value. The magnetic field sensor can also include means for generating an error signal indicative or an error or indicative of no error in response to the comparing.

In accordance with another example useful for understanding another aspect of the present invention, a non-transitory machine-readable storage medium for storing executable instructions in a magnetic field sensor, the instructions can include instructions for receiving a first bridge signal, the first bridge signal generated by a first full bridge circuit. The instructions can also include instructions for receiving a second bridge signal, the second bridge signal generated by a second full bridge circuit. The instructions can also include instructions for determining a bridge separation from the first bridge signal and the second bridge signal. The instructions can also include instructions for comparing a function of the bridge separation to a threshold value. The instructions can also include instructions for generating an error signal indicative or an error or indicative of no error in response to the comparing.

BRIEF DESCRIPTION OF THE DRAWINGS

The foregoing features of the invention, as well as the invention itself may be more fully understood from the following detailed description of the drawings, in which.

DETAILED DESCRIPTION

Figure 1:
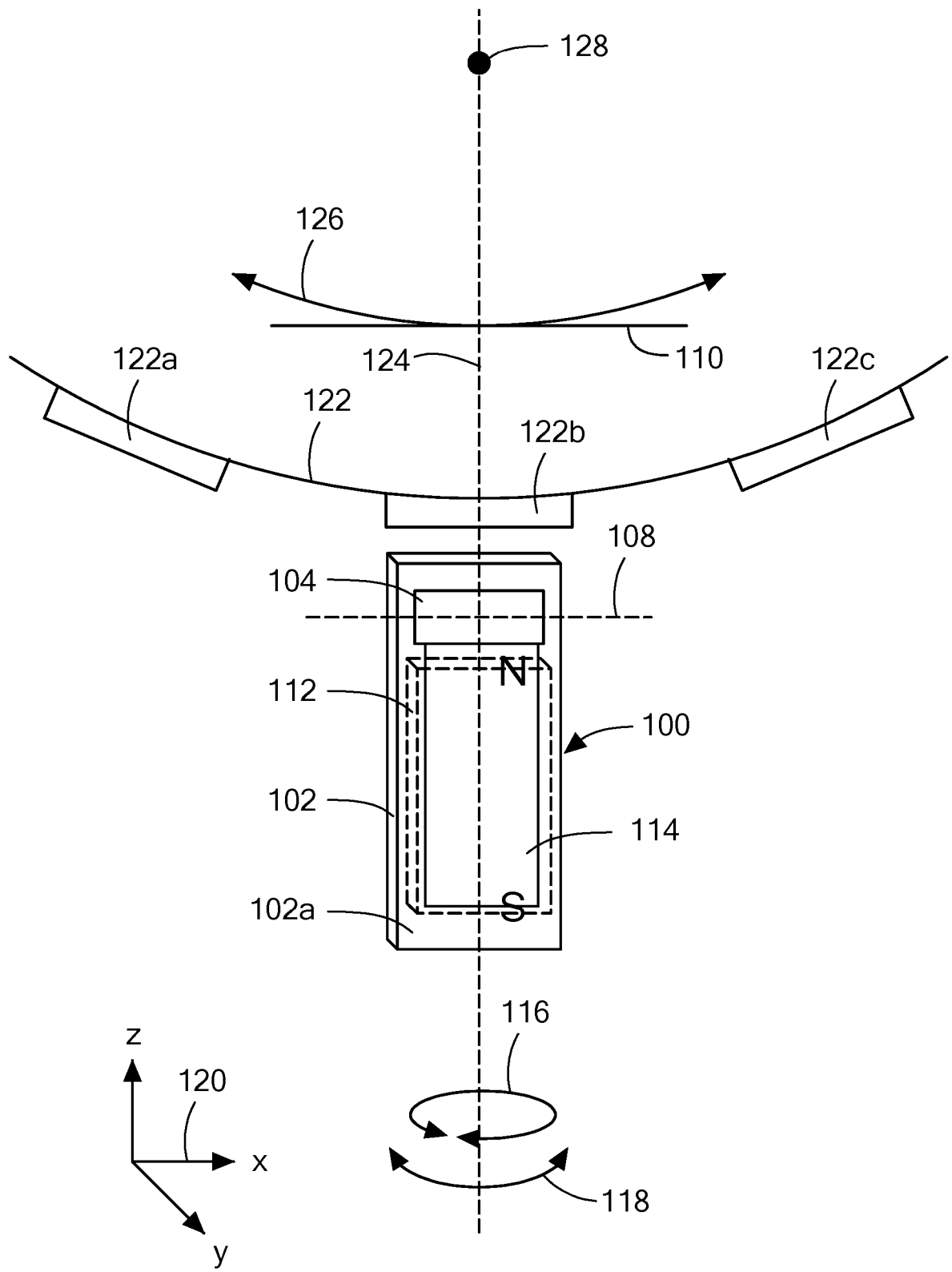
FIG. 1 is a block diagram showing an illustrative back-biased magnetic field sensor proximate to a gear operable to rotate.

Before describing the present invention, it should be noted that reference is sometimes made herein to GMR or TMR elements having particular shapes (e.g., yoke shaped or pillar shaped). One of ordinary skill in the art will appreciate, however, that the techniques described herein are applicable to a variety of sizes and shapes.

As used herein, the term "magnetic field sensing element" is used to describe a variety of different types of electronic elements that can sense a magnetic field. A magnetoresistance element is but one type of magnetic field sensing element.

As is known, there are different types of magnetoresistance elements, for example, a semiconductor magnetoresistance element such as Indium Antimonide (InSb), a giant magnetoresistance (GMR) element, an anisotropic magnetoresistance element (AMR), and a tunneling magnetoresistance (TMR) element, also called a magnetic tunnel junction (MTJ) element.

As is known, metal based or metallic magnetoresistance elements (e.g., GMR, TMR, AMR) tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The terms "parallel" and" perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/−ten degrees.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals.

In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital.

As used herein, the term "module" is used to describe a "processor."

A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

In particular, it should be understood that a so-called comparator can be comprised of an analog comparator having a two-state output signal indicative of an input signal being above or below a threshold level (or indicative of one input signal being above or below another input signal). However, the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the term "active electronic component" is used to describe an electronic component that has at least one p-n junction. A transistor, a diode, and a logic gate are examples of active electronic components. In contrast, as used herein, the term "passive electronic component" as used to describe an electronic component that does not have at least one p-n junction. A capacitor and a resistor are examples of passive electronic components.

As used herein, the term "amplifier" is used to describe a circuit element with a gain greater than one, less than one, or equal to one.

While GMR elements may be used in examples herein, the same concepts apply to TMR elements, except for a particular structure shown below in FIG. 13.

Referring now to FIG. 1, a magnetic field sensor 100 is responsive to a gear 122 having gear teeth, e.g., gear teeth 122a, 122b, 122c. The gear 122 can be a ferromagnetic gear, i.e., a ferromagnetic target object having ferromagnetic teeth, also ferromagnetic objects, and referred to herein as target features. The magnetic field sensor 100 can include a substrate 102 with a major surface 102a.

The magnetic field sensor 100 can include magnetic field sensing elements 104, e.g., magnetoresistance elements, disposed on the major surface 102a of the substrate 102. Further details of the magnetic field sensing elements 104 are described below. However, let is suffice here to say that the magnetic field sensing elements 104 can include at least two magnetoresistance elements.

The magnetic field sensing elements 104 can be coupled to or within an electronic circuit 114 also disposed on the major surface 102a of the substrate 102.

The magnetic field sensor 100 can also include a magnet 112. The magnet 112 is configured to generate a magnetic field, which is generally directed along an axis 108 at the position of the magnetic field sensing elements 104, and is generally parallel to the major surface 102a of the substrate 102.

The magnetic field sensing elements 104 have respective maximum response axes parallel to the major surface 102a of the substrate 102. In some embodiments, the maximum response axes are parallel to each other. In some embodiments, the maximum response axes are substantially parallel to the axis 108. In other embodiments, the maximum response axes are substantially perpendicular to the axis 108.

A line perpendicular to the major surface 102a of the substrate (i.e., into the page) intersects the magnet 112 and does not intersect the gear 122. Furthermore, in some embodiments, the magnetic field sensing elements 104 are disposed at positions such that an axis (e.g., 108) between (i.e., passing through) the magnetic field sensing elements 104 does not intersect the gear 122. In some embodiments, the axis (e.g., 108) between (i.e., passing through) the magnetic field sensing elements 104 is substantially parallel to a tangent 110 to a direction of movement, e.g., 126, of the gear 122.

In the embodiment shown, a line between north (N) and south (S) poles of the magnet 112 is substantially parallel to the major surface 102a of the substrate 102, and is substantially perpendicular to the axis (e.g., 108) between (i.e., passing through) the magnetic field sensing elements 104, e.g., two magnetic field sensing elements. In some embodiments, the line between the north and south poles of the magnet 112 intersects the gear 122.

The electronic circuit 114 is configured to generate an output signal (not shown). Exemplary electronic circuits 114 are described below in conjunction with FIGS. 8 and 9.

The output signal, when the gear 122 is rotating, is indicative of a speed of rotation of the gear 122. The magnetic field sensor 100 is able to provide a tooth detecting function The magnet 112 can be comprised of one uniform material, and can have no central core. However, in other embodiments, the magnet 112 can have a central core. Such central core can have an axis aligned with an axis 124.

The magnetic field sensor 100 can be rotated in a direction 116 to a next position three hundred and sixty degrees apart from the position shown, with no degradation of performance. However, intermediate rotations may result in a degradation of performance.

The magnetic field sensor 100 can be rotated in a direction of and arrow 118 with a center of rotation anywhere along a line 124, through approximately +/−twenty degrees, without substantial degradation of performance.

Figure 2:
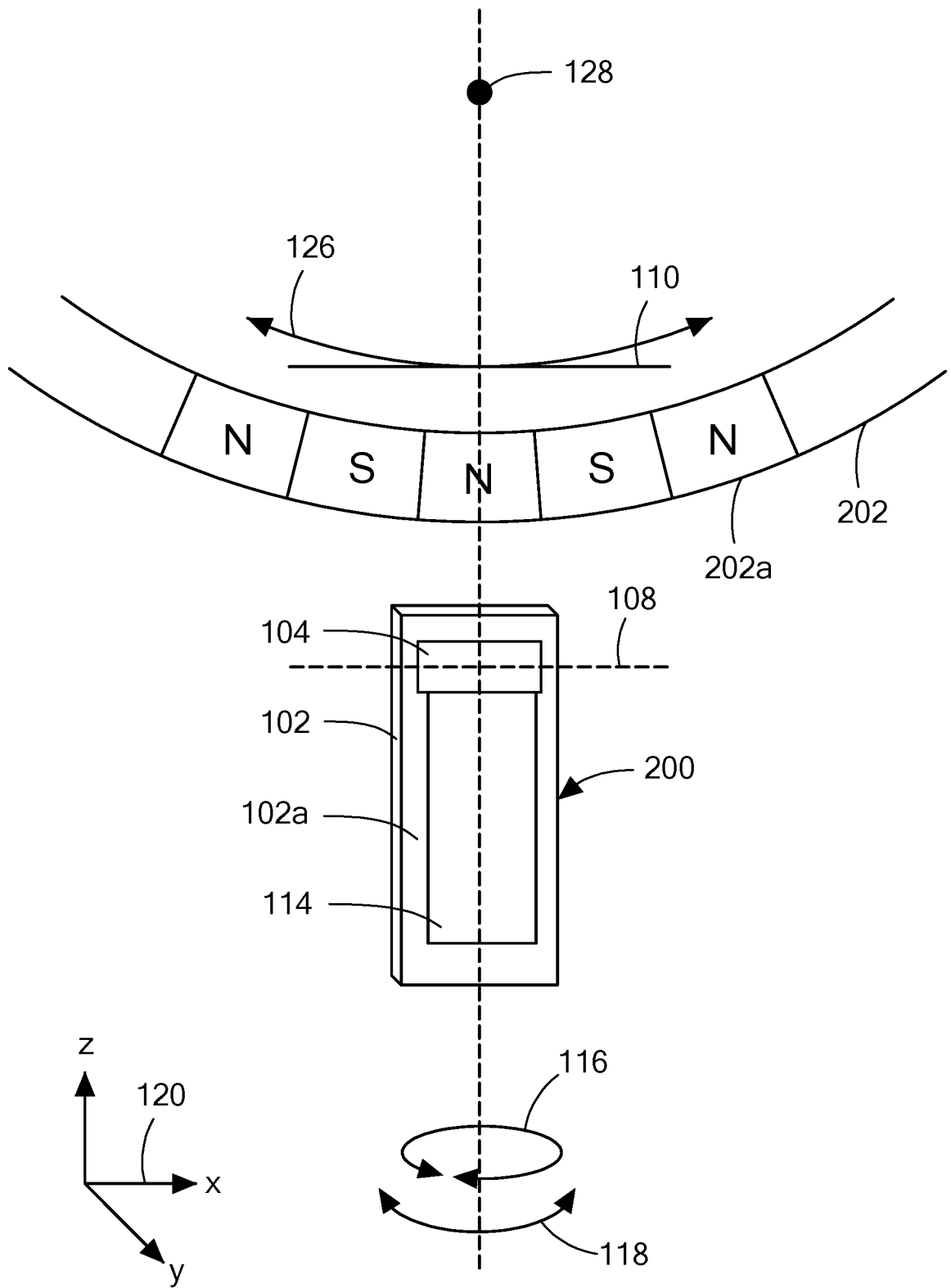
FIG. 2 is a block diagram showing an illustrative magnetic field sensor proximate to a ring magnet operable to rotate

Referring now to FIG. 2, in which like elements of FIG. 1 have like reference designations, a magnetic field sensor 200 can include elements of the magnetic field sensor 100 of FIG. 1, but without the magnet 106. The magnetic field sensor 200 can be responsive to a ring magnet 202 having poles, e.g., 202a.

Figure 3:
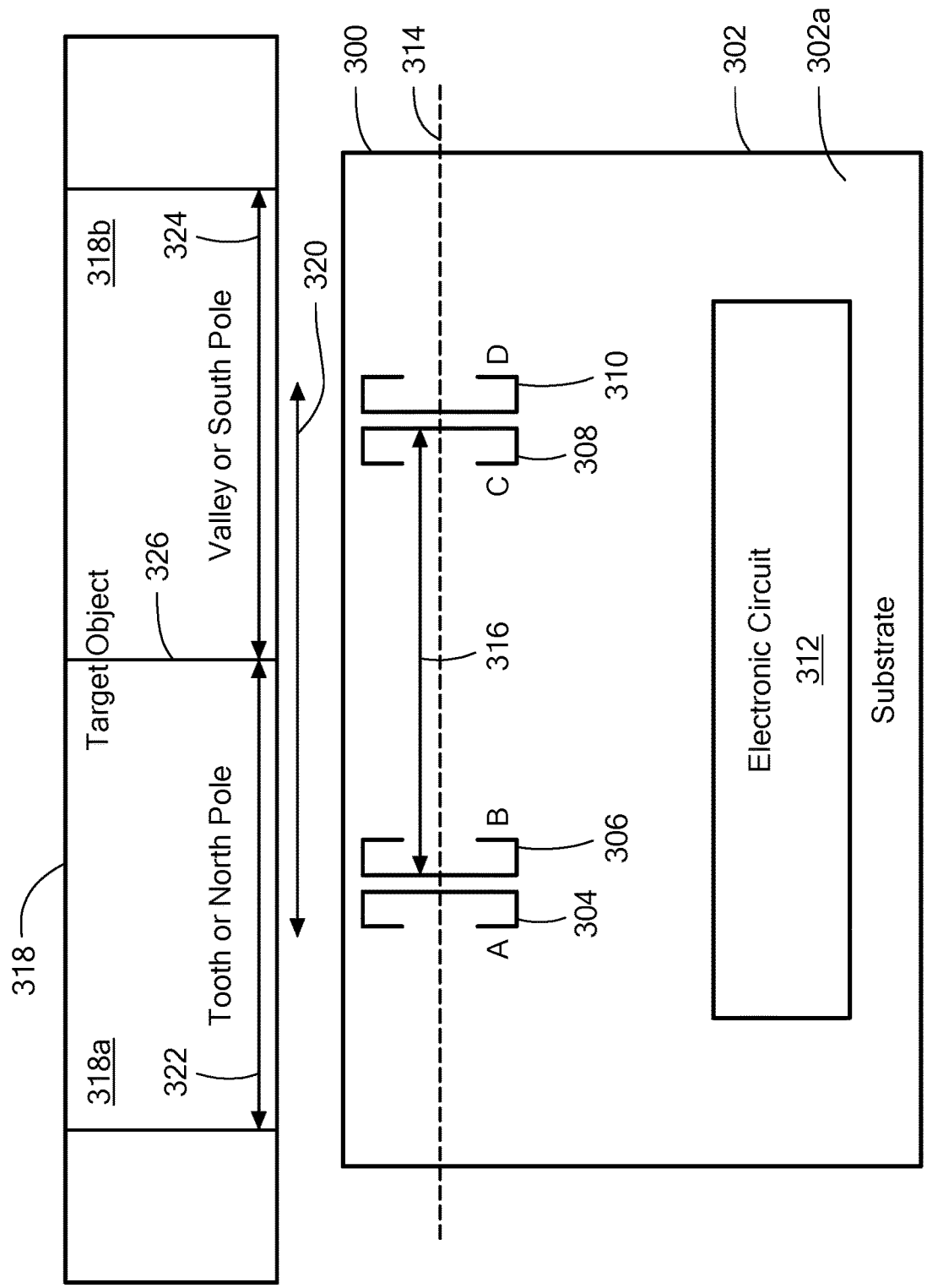
FIG. 3 is block diagram showing an illustrative magnetic field sensor having four magnetoresistance elements and proximate to a target object operable to move.

Referring now to FIG. 3, a magnetic field sensor 300 can include a substrate 300 having a major surface 302a. Magnetoresistance elements 304, 306, 308, 310 can be disposed on, over, or within the surface 302a. Centers of the magnetoresistance elements 304, 306, 308, 310 can be disposed along a straight line 314. The magnetoresistance elements 304, 306, 308, 310 can be arranged as a first pair of proximate magnetoresistance elements 304, 306 and a second pair of proximate magnetoresistance elements 308, 310, each having a respective maximum response axis parallel to the line 314. A center of the first pair of magnetoresistance elements 304, 306 can be separated from a center of the second pair of magnetoresistance elements 308, 310 by a distance 316.

The first pair of magnetoresistance elements 304, 306 can be coupled along with two fixed resistors (shown below in FIG. 5) in a first full bridge and the second pair of magnetoresistance elements 308, 310 can be coupled along with another two fixed resistors (shown below in FIG. 5) in a second full bridge. The two bridges can be the same as or similar to two bridges described below in conjunction with FIG. 5 below.

The above fixed resistors are preferably resistors that have temperature coefficients that match temperature coefficients of the four magnetoresistance elements 304, 306, 308, 310. Having such resistors can reduce or eliminate DC offset drift due to temperature of bridge arrangements. To this end, the fixed resistors can be fabricated as part of, or all of, nonresponsive magnetoresistance elements similar to the four magnetoresistance elements 304, 306, 308, 310 but having no response or very little response to magnetic fields. Nonresponsive magnetoresistance elements are also referred to herein as dummy magnetoresistance elements.

As used herein, the term "nonresponsive" can be used to describe having no response or having a response greatly reduced from a normal response, i.e., substantially less response.

In some embodiments, the nonresponsive magnetoresistance elements can be fabricated without a free layer as in U.S. Pat. No. 7,777,607, issued Aug. 17, 2010, which is assigned to the assignee of the present invention and which is incorporated by reference herein in its entirety. In some other embodiments, the nonresponsive magnetoresistance elements can be fully fabricated to have the same layers as the magnetoresistance elements 304, 306, 308, 310, but for which the response to magnetic fields can be destroyed in one of a number of ways. For example, the response of the magnetoresistance elements can be destroyed a) by way of ion implantation in the nonresponsive magnetoresistance elements, b) by way of driving a large enough current through the nonresponsive magnetoresistance elements that the current results in electro-migration, or c) forming the nonresponsive magnetoresistance elements as a plurality of thin yokes or strips of magnetoresistance element material, thinner than the yokes or strips of the magnetoresistance elements 304, 306, 308, 310, coupled in parallel as described below in conjunction with FIG. 13.

The magnetic field sensor can also include an electronic circuit 312 coupled to the magnetoresistance elements 304, 306, 308, 310 and disposed on, under, or within the surface 302a of the substrate 302. Illustrative electronic circuits are described below in conjunction with FIGS. 8 and 9.

The magnetic field sensor can be operable to sense a speed of motion of a target object 318 operable to move in one of or both of two directions represented by an arrow 320.

In some arrangements, the target object 318 can be a ferromagnetic gear like the gear 122 of FIG. 1, in which case, the gear can have a plurality of teeth 318a and a plurality of valleys 318b.

In other arrangements, the target object 318 can be a ring magnet like the rig magnet 202 of FIG. 2, in which case, the ring magnet can have a plurality of north poles 318a and a plurality of south poles 318b.

The teeth or north poles and the valleys or south poles can have widths illustrated by arrows 322, 324, respectively. In some embodiments, the distance 316 can be the same as the widths 322, 324. However, the distance 316 can be between one half of and one and one half of the widths 322, 324.

It should be appreciated that, when the first pair of magnetoresistance elements 304, 306 and the second pair of magnetoresistance elements 308, 310 are considered differentially, the magnetic field sensor can have a maximum output when the first and second pairs straddle an edge, e.g., 326, between features of the target object 318. Thus, the magnetic field sensor can be a so-called "edge detector."

Figure 4:
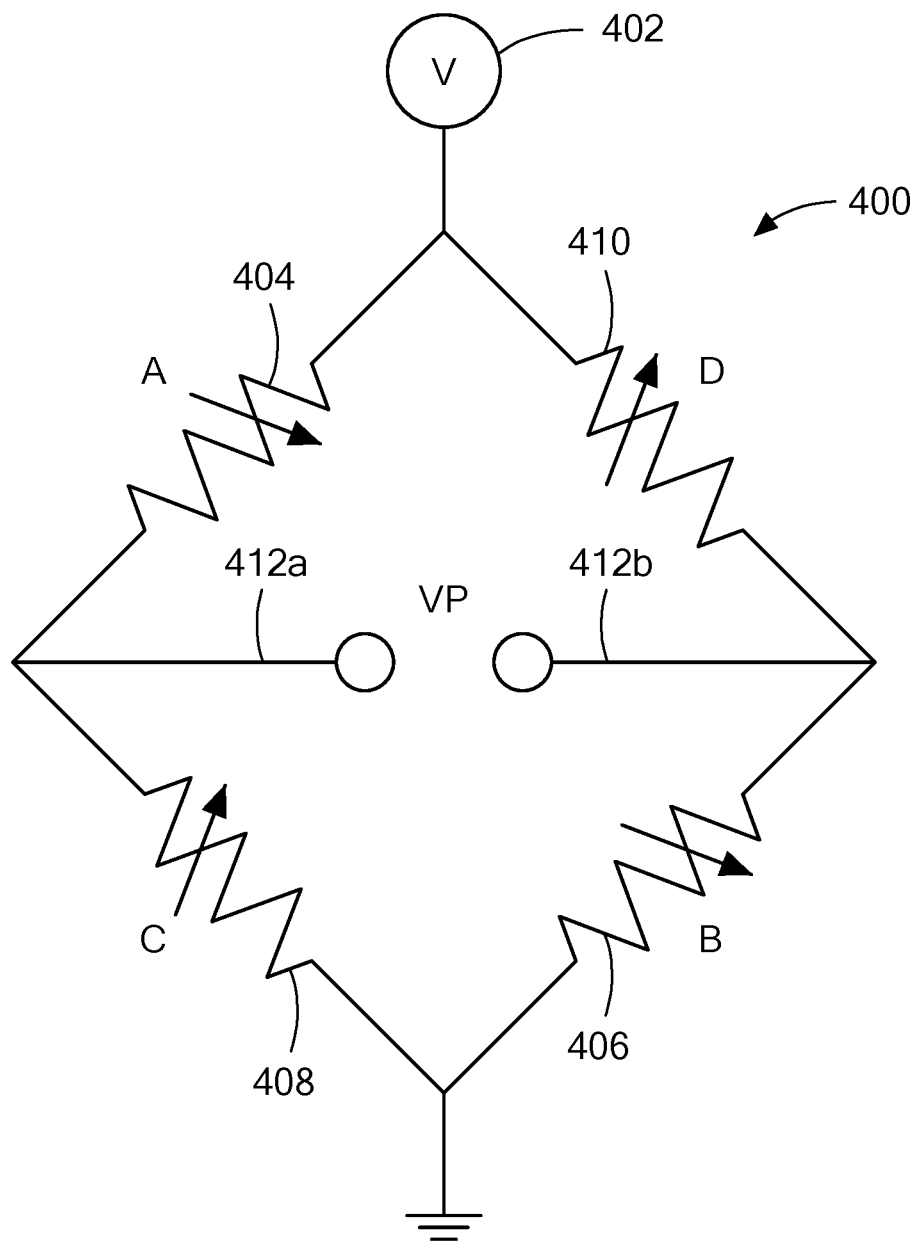
FIG. 4 is a schematic diagram showing four magnetoresistance elements coupled in a full bridge arrangement.

Referring now to FIG. 4, a full bridge arrangement 400 can include four magnetoresistance elements 404, 406, 408, 410, which can be the same as or similar to the four magnetoresistance elements 304, 306, 308, 310 of FIG. 3, respectively, and is similarly labeled A, B, C, D. The full bridge arrangement can be coupled between a voltage source 402 and a reference voltage, e.g., ground. The full bridge arrangement provides a differential signal 412a, 412b, also referred to as signal VP, which has a differential relationship between a first pair of magnetoresistance elements 404, 406, and a second pair of magnetoresistance elements 408, 410.

The full bridge arrangement 400 is not able to distinguish if one of the pairs A, B or C, B is in saturation, or both pairs.

Figure 5:
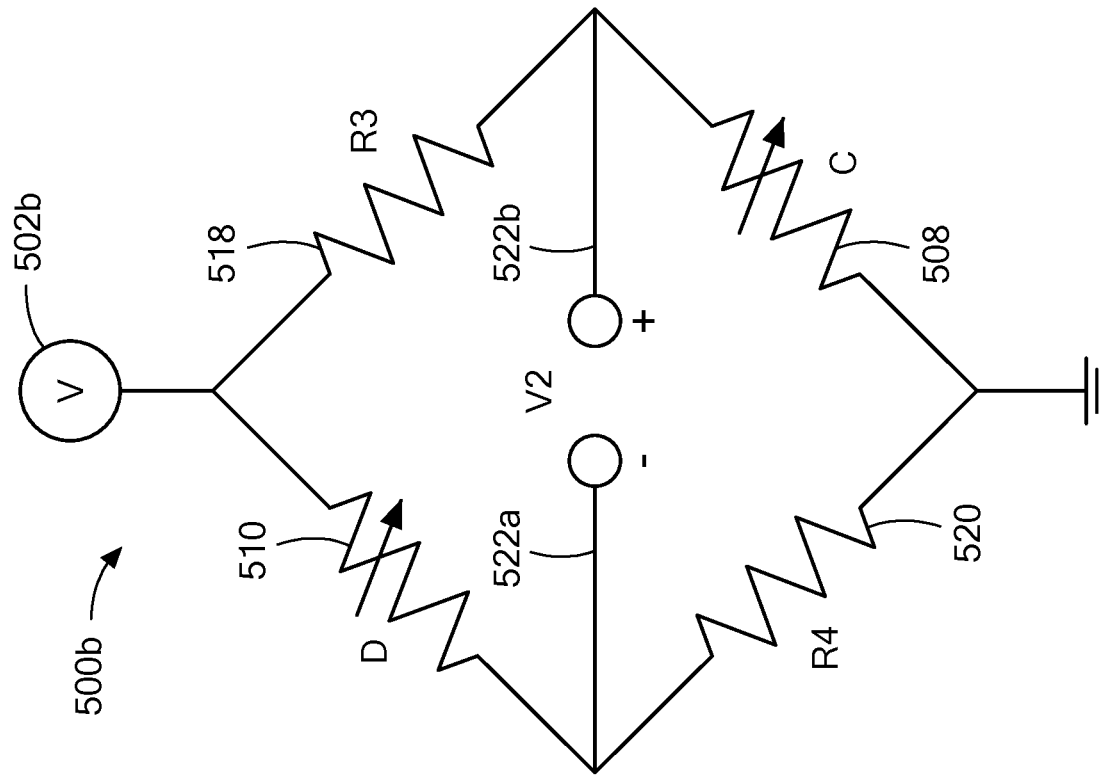
FIG. 5 is a schematic diagram showing four magnetoresistance elements coupled two full bridge arrangements.
Figure 5:
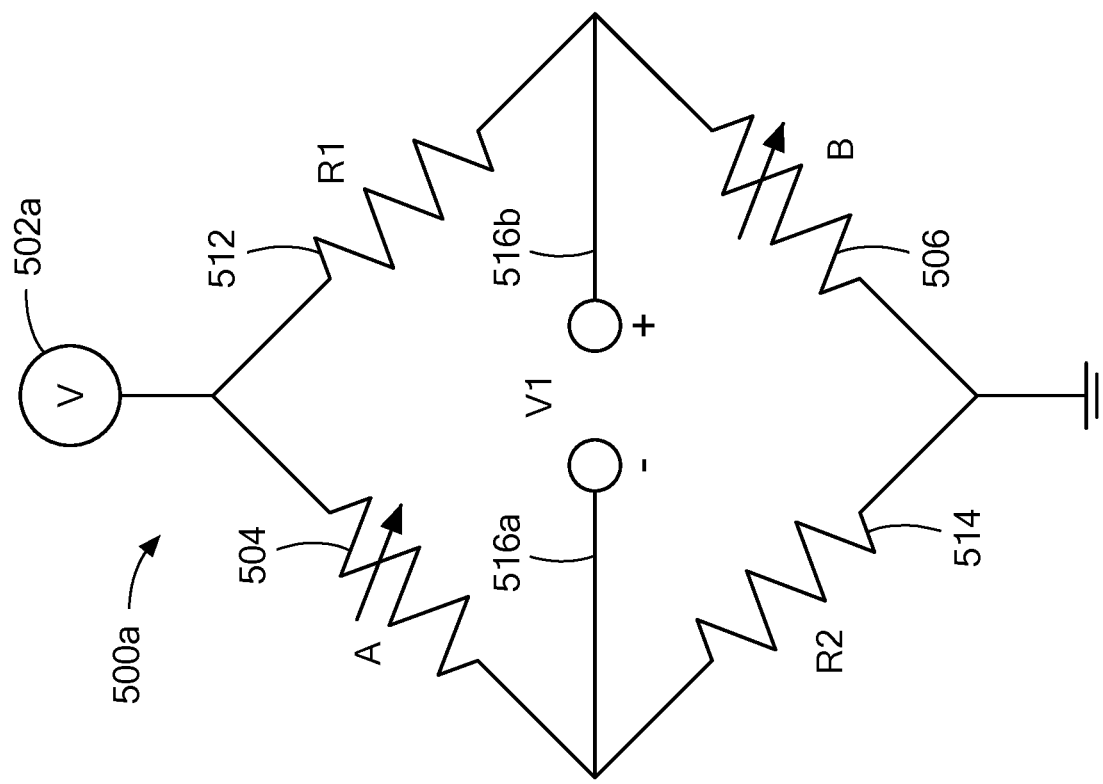

Referring now to FIG. 5, first and second full bridge arrangements 500a, 500b, respectively, can include four magnetoresistance elements 504, 506, 508, 510, which can be the same as or similar to the four magnetoresistance elements 304, 306, 308, 310 of FIG. 3, respectively, and is similarly labeled A, B, C, D. The first full bridge arrangement 502a can also include first and second fixed resistors 512, 514, respectively, and the second full bridge arrangement 500b can include third and fourth fixed resistors 518, 520, respectively.

The first, second, third, and fourth fixed resistors 512, 514, 518, 520, respectively, can either be temperature compensated normal resistors or nonresponsive magnetoresistance elements described above in conjunction with FIG. 3 and below in conjunction with FIG. 13.

In other embodiments, the first, second, third, and fourth fixed resistors 512, 514, 518, 520 can be replaced by respective active magnetoresistance elements, but pinned to a different direction than the four magnetoresistance elements 504, 506, 508, 510, resulting in respective maximum response axes pointing to a different direction than, e.g., one hundred eighty degrees relative to, maximum response axes of the four magnetoresistance elements 504, 506, 508, 510.

The first full bridge arrangement 500a can be operable to generate a first differential signal 516a, 516b, also referred to as a signal V1, indicative of a magnetic field experienced by a first pair of magnetoresistance elements 504, 506, i.e., by the first pair of magnetoresistance elements 304, 306 of FIG. 3. The second full bridge arrangement 500b can be operable to generate a second differential signal 522a, 522b, also referred to as a signal V2, indicative of a magnetic field experienced by a second pair of magnetoresistance elements 508, 510, i.e., by the second pair of magnetoresistance elements 308, 310 of FIG. 3.

It should be understood that neither of the first or second differential signals 516a, 516b or 522a, 522b, respectively is indicative of a difference between signals generate by the first and second pairs of magnetoresistance elements. However, the first and second differential signals 516a, 516b or 522a, 522b can again be differenced to generate the edge detector described above in conjunction with FIG. 3.

Unlike the full bridge arrangement 400 of FIG. 4, the full bridge arrangements 500a, 500b are able to distinguish if one of the pairs A, B or C, B is in saturation, or both pairs.

Figure 6:
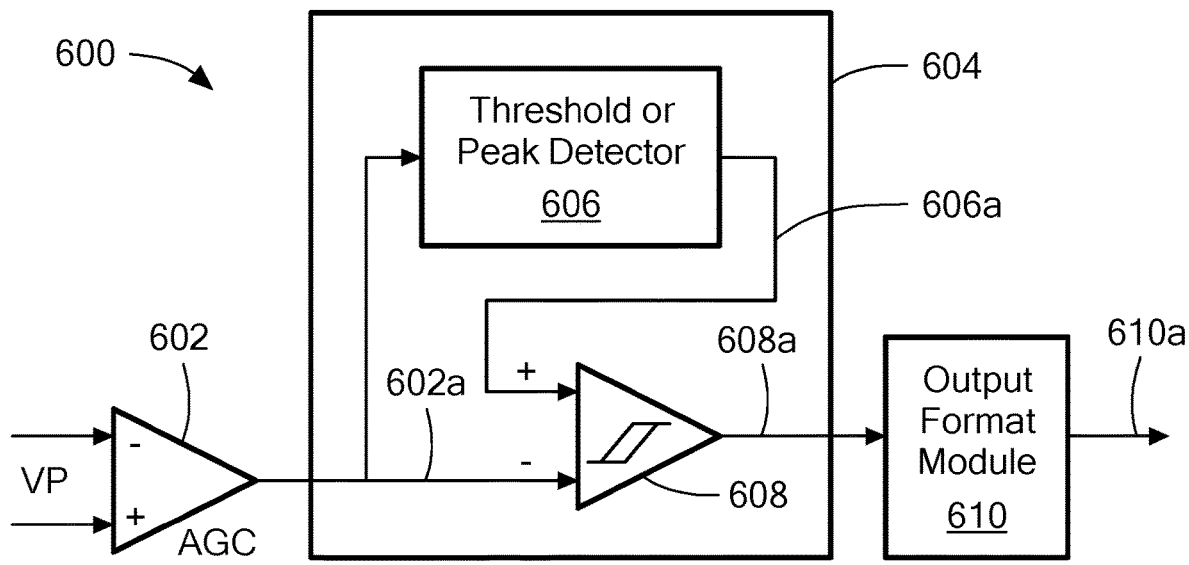
FIG. 6 is a block diagram showing a prior art magnetic field sensor that receives a signal from the full bridge arrangement of FIG. 4.

Referring now to FIG. 6, an electronic circuit 600 can include a differential amplifier 602 (with or without automatic gain control) to receive the signal VP shown above in FIG. 4 and can be operable to generate an amplified signal 602a.

A module 604 can include a comparator 608 coupled to receive the amplified signal 602a. The module 604 can also include a threshold or peak detector 606 coupled to receive the amplified signal 602a.

In operation, the threshold or peak detectors can generate a threshold signal. The threshold or peak detector 606 is not described more fully herein. Various types of threshold detectors and peak detectors are known. Let it suffice to say that a threshold detector can generate the threshold signal 606a as a percentage of a peak-to-peak value of the amplified signal 602a. In contrast, a peak detector can generate the threshold signal 606a as a predetermined amount below a positive peak and/or above a negative peak of the amplified signal; 602a. The comparator 608 can also be coupled to receive the threshold signal 606a.

The comparator 608 can generate a comparison signal 608a as a two-state signal for which a frequency is indicative of a rate at which features, e.g., gear teeth or poles, of a target object pass by the electronic circuit 600. Thus, the comparison signal 608a is also indicative of a speed of rotation of the target object.

An output format module 610 can receive the comparison signal 608a and can generate a formatted signal 610a also indicative of the speed of rotation of the target object. The formatted signal 610a can be in one of a variety of formats, including, but not limited to, SENT, I2C, PWM, or any serial digital format.

Figure 7:
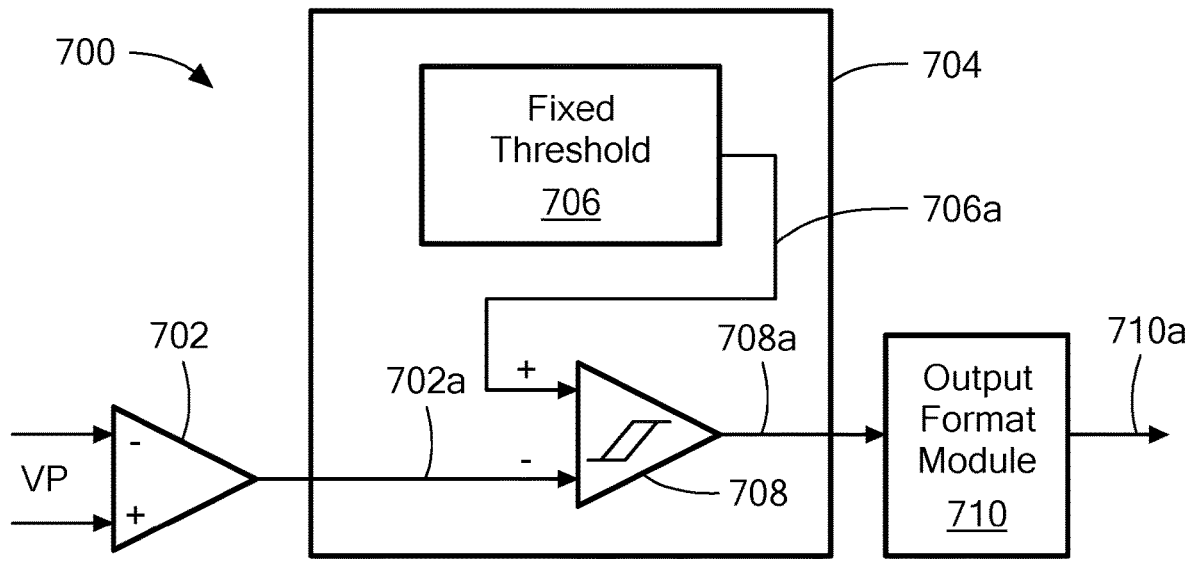
FIG. 7 is a block diagram showing another prior art magnetic field sensor that receives a signal from the full bridge arrangement of FIG. 4.

Referring now to FIG. 7, an electronic circuit 700 can include a differential amplifier 702 (with or without automatic gain control) to receive the signal VP shown above in FIG. 4 and can be operable to generate an amplified signal 702a.

A module 704 can include a comparator 708 coupled to receive the amplified signal 702a. The comparator 708 can also be coupled to receive a threshold signal 706a. Unlike the electronic circuit 600 of FIG. 6, the threshold signal 706a can have a fixed and predetermined value generated by a fixed threshold module 706.

The comparator 708 can generate a comparison signal 708a as a two-state signal for which a frequency is indicative of a rate at which features, e.g., gear teeth or poles, of a target object pass by the electronic circuit 700. Thus, the comparison signal 708a is also indicative of a speed of rotation of the target object.

An output format module 710 can receive the comparison signal 708a and can generate a formatted signal 710a also indicative of the speed of rotation of the target object. The formatted signal 710a can be in one of a variety of formats, including, but not limited to, SENT, I2C, PWM, or any serial digital format.

Figure 8:
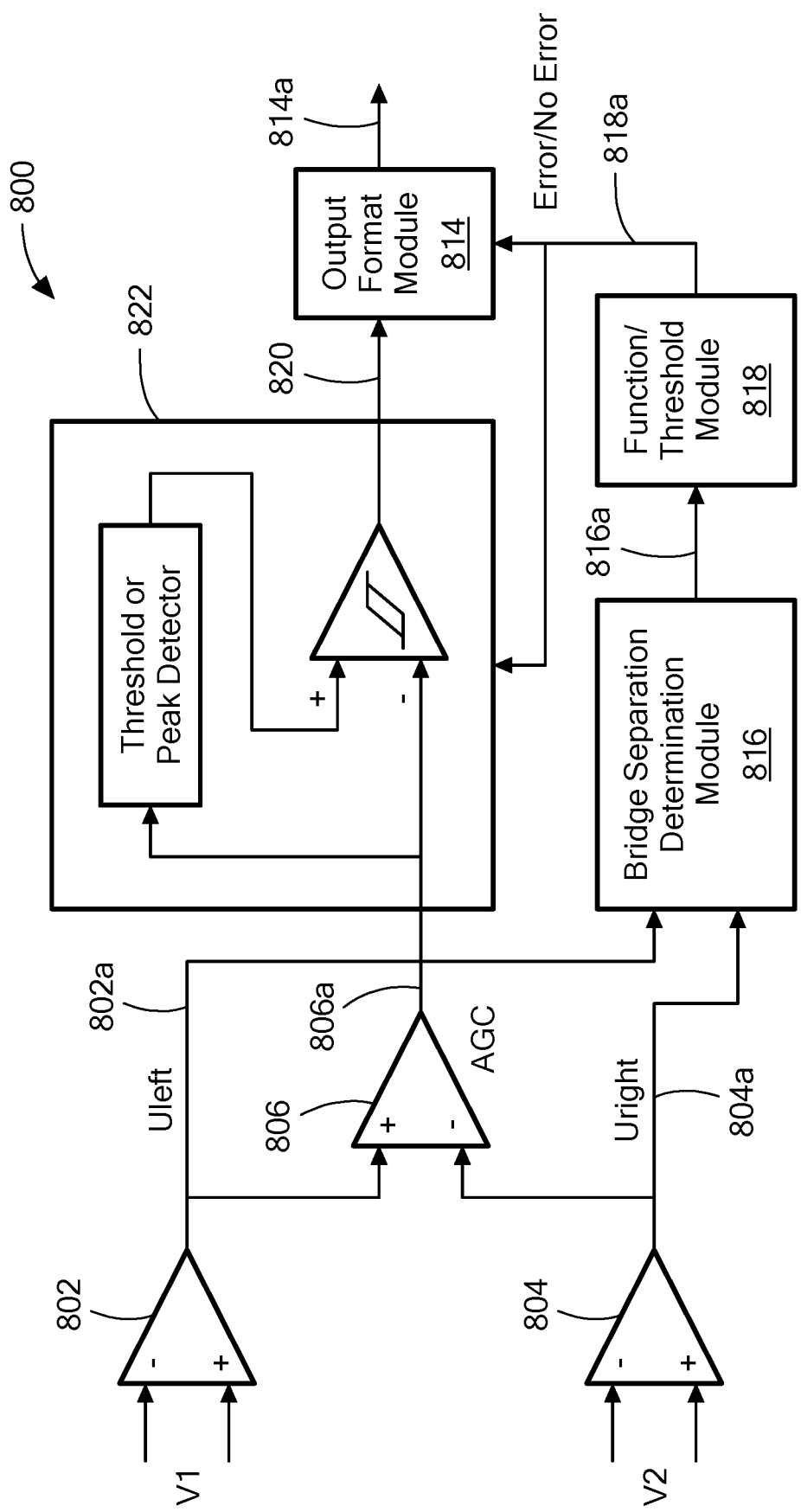
FIG. 8 is a block diagram showing an illustrative magnetic field sensor, having a bridge separation determination module and a function/threshold module, that receives two signals from the two full bridge arrangements, respectively, of FIG. 5.

Referring now to FIG. 8, in which like elements of FIG. 6 have like reference designations, an electronic circuit 800, which can be like the electronic circuit 312 of FIG. 3, can include a first differential amplifier 802 (with or without automatic gain control) to receive the signal V1 shown above in FIG. 5 and can be operable to generate a first amplified signal 802a, also referred to herein as a Uleft signal. A second differential amplifier 804 (with or without automatic gain control) can receive the signal V2 shown above in FIG. 5 and can be operable to generate a second amplified signal 804a, also referred to herein as a Uright signal.

A third differential amplifier 806 can receive the first and second amplified signals 802a, 804a and can be operable to generate a third amplified signal 806a. It should be understood that the third amplified signal 806a can be indicative of a difference between the signals V1 and V2, or a difference between signals Uleft and Uright, i.e., Uleft-Uright.

The electronic circuit 800 can also include a bridge separation determination module 816 coupled to receive the first and second amplified signals 802a, 804a and operable to generate a bridge separation signal or value 816a, also referred to herein as a BR signal or value, indicative of a ratio between the first and second amplified signals 802a, 804a.

The electronic circuit 800 can also include a function/threshold module 818 coupled to receive the bridge separation signal 816a and operable to generate an error/no error signal 818a. The error/no error signal 818a can be a two-state signal indicative of an error condition or indicative of no error condition.

A module 822 can be the same as or similar to the module 604 of FIG. 6 and can be can be coupled to receive the third amplified signal 806a. General operation of the module 604 is described above in conjunction with FIG. 6. Here, however, in some embodiments, the module 822 can include an input node to receive the error/no error signal 818a and can effectively stop operation of the module 822 when the error/no error signal 818a is indicative of an error condition.

The module 822 can be operable to generate a comparison signal 820, which can be the same as or similar to the comparison signal 608a of FIG. 6.

An output format module 814 can be similar to the output format module 610 of FIG. 6. Here, however, the output format module 814 can include an input node to receive the error/no error signal 818a. In response of the error/no error signal 818a, the output format module 814 can be operable to change a behavior of a formatted signal 814a in response to the error/no error signal 818a indicative of an error condition. For example, in some embodiments, the output format module 814 can cause the formatted signal 814a to become inactive in response to the error/no error signal 818a being indicative of the error condition.

In operation, the bridge separation signal 816a can have a ratio form, for example, a ratio of the first amplified signal 802a and the second amplified signal 804a. It should be appreciated that when the signals V1 or V2 are not in saturation, i.e., when the magnetoresistance elements that generate the signals V1 or V2 are not in saturation, then the bridge separation signal 816a is close to one. However, when one of or both of the magnetoresistance elements to generate the signals V1 or V2 are in saturation, then the bridge separation signal 816a departs from a value of one.

It should be understood that, whenever either of the signals V1 or V2 is in saturation, the third amplified signal 806a may be an incorrect signal, and the electronic circuit 800 may generate the comparison signal 604a that is not indicative of a speed of rotation of a target object. Essentially, the third amplified signal 806a can lose common mode rejection of common magnetic fields sensed by the two pairs A, B and C, D (FIG. 5) of magnetoresistance elements. When in this condition (an error condition), the comparison signal 604a may have state transitions at incorrect times or even when the target object is not moving The external magnetic field that causes the error condition can occur due to an external magnetic field beyond a magnetic field generated by a target object, for example, a ring magnet. However, the error condition can also occur in part or in total due to the target object, and when the target object is moving or not moving. The error condition can occur at all rotations of the target object or only at some rotations of the target object.

In some embodiments, the bridge separation determination module 816 can identify a bridge ratio, BR:

$$BR = U\text{left}/U\text{right (or } U\text{right}/U\text{left)} \quad (1)$$

in which BR is the bridge separation signal or value 816a, also referred to as a bridge ratio, BR.

In some embodiments, the function/threshold module 818 can generate a function, f:

$$f = |BR - 1|, \quad (2)$$

in which the vertical bars are indicative of an absolute value.

It should be apparent that when the bridge ratio, BR, is near one, then the function, f, is near zero. In order to identify if the magnetoresistance elements that generate the signals V1 or V2 are in saturation, a threshold can be applied to the function, f:

$$f > P, \quad (3)$$

in which P can be a predetermined threshold or threshold value.

In some other embodiments, the bridge separation determination module 816 can identify a bridge difference, BD:

$$BD = U\text{left} - U\text{right} \quad (4)$$

in which BD is the bridge separation signal or value 816a, i.e., a bridge difference signal, BD.

In some embodiments, the function/threshold module 818 can generate a function, g:

$$g = |BR|, \quad (5)$$

in which the vertical bars are indicative of an absolute value.

In order to identify if the magnetoresistance elements that generate the signals V1 or V2 are in saturation, a threshold Q can be applied to the function, g:

$$g > Q, \quad (6)$$

in which Q can be a different predetermined threshold or threshold value different than the threshold P above.

The above functions and thresholds are described again below in conjunction with FIGS. 10 and 11.

Figure 9:
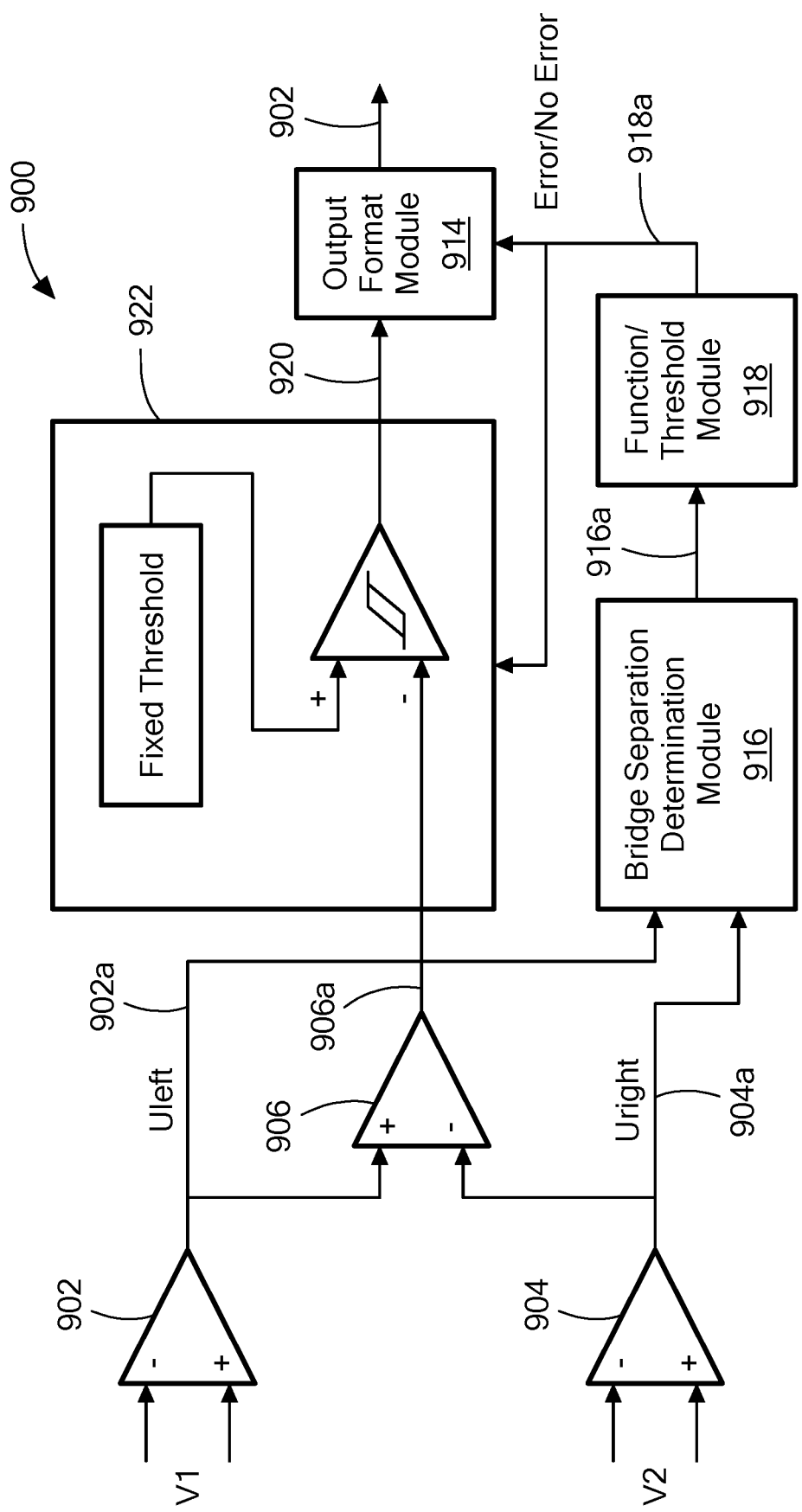
FIG. 9 is a block diagram showing another illustrative magnetic field sensor, having a bridge separation determination module and a function/threshold module, that receives two signals from the two full bridge arrangements, respectively, of FIG. 5.

Referring now to FIG. 9, in which like elements of FIG. 7 have like reference designations, an electronic circuit 900 which can be like the electronic circuit 312 of FIG. 3, can include a first differential amplifier 902 (with or without automatic gain control) to receive the signal V1 shown above in FIG. 5 and can be operable to generate a first amplified signal 902a, also referred to herein as a Uleft signal. A second differential amplifier 904 (with or without automatic gain control) can receive the signal V2 shown above in FIG. 5 and can be operable to generate a second amplified signal 904a, also referred to herein as a Uright signal.

A third differential amplifier 906 can receive the first and second amplified signals 902a, 904a and can be operable to generate a third amplified signal 906a. It should be understood that the third amplified signal 906a can be indicative of a difference between the signals V1 and V2, or a difference between signals Uleft and Uright, i.e., Uleft-Uright.

The electronic circuit 900 can also include a bridge separation determination module 916 coupled to receive the first and second amplified signals 902a, 904a and operable to generate a bridge separation signal or value 916a, also referred to herein as a bridge ratio, BR, signal or value, or, alternatively, a bridge difference, BD, signal or value indicative of a separation between the first and second amplified signals 902a, 904a in accordance with equation (1) or (4) above.

The electronic circuit 900 can also include a function/threshold module 918 coupled to receive the bridge separation signal 916a and operable to generate an error/no error signal 918a. The error/no error signal 918a can be a two-state signal indicative of an error condition or indicative of no error condition.

A module 922 can be the same as or similar to the module 704 of FIG. 7 and can be can be coupled to receive the third amplified signal 906a. General operation of the module 704 is described above in conjunction with FIG. 7. Here, however, in some embodiments, the module 922 can include an input node to receive the error/no error signal 918a and can effectively stop operation of the module 922 when the error/no error signal 918a is indicative of an error condition.

The module 922 can be operable to generate a two-state comparison signal 920, which can be the same as or similar to the comparison signal 708a of FIG. 7.

An output format module 914 can be similar to the output format module 710 of FIG. 7. Here, however, the output format module 914 can include an input node to receive the error/no error signal 918a. In response of the error/no error signal 918a, the output format module 914 can be operable to change a behavior of a formatted signal 914a in response to the error/no error signal 918a indicative of an error condition. For example, in some embodiments, the output format module 914 can cause the formatted signal 914a to become inactive in response to the error/no error signal 918a being indicative of the error condition.

Operation of the bridge separation determination module 916 and of the function/threshold module 918 can be the same as or similar to operation described above in conjunction with similar modules 816, 818 of FIG. 8.

Figure 10:
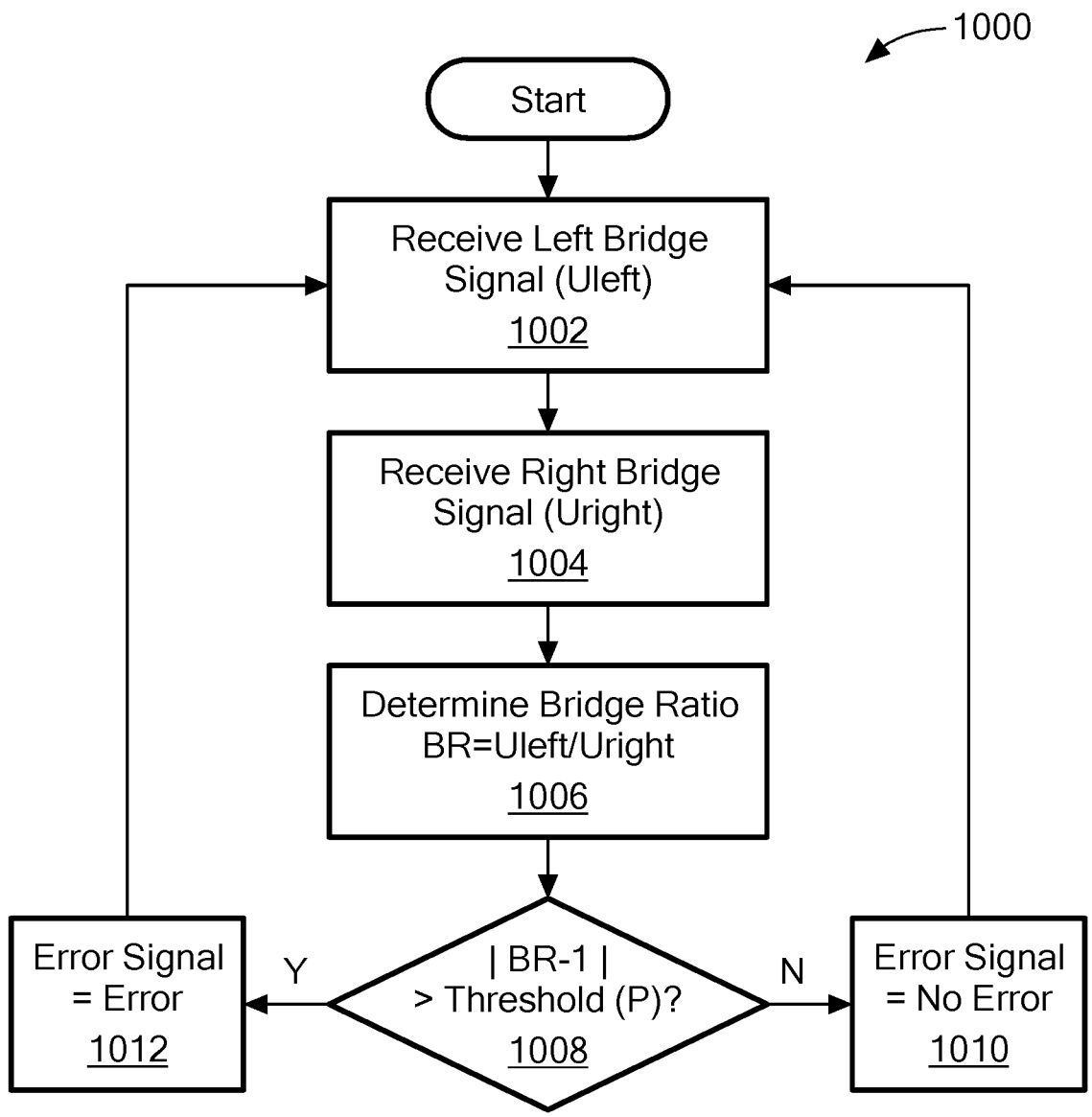
FIG. 10 is a flow chart showing an illustrative method used by the magnetic field sensors of FIGS. 8 and 9.
Figure 11:
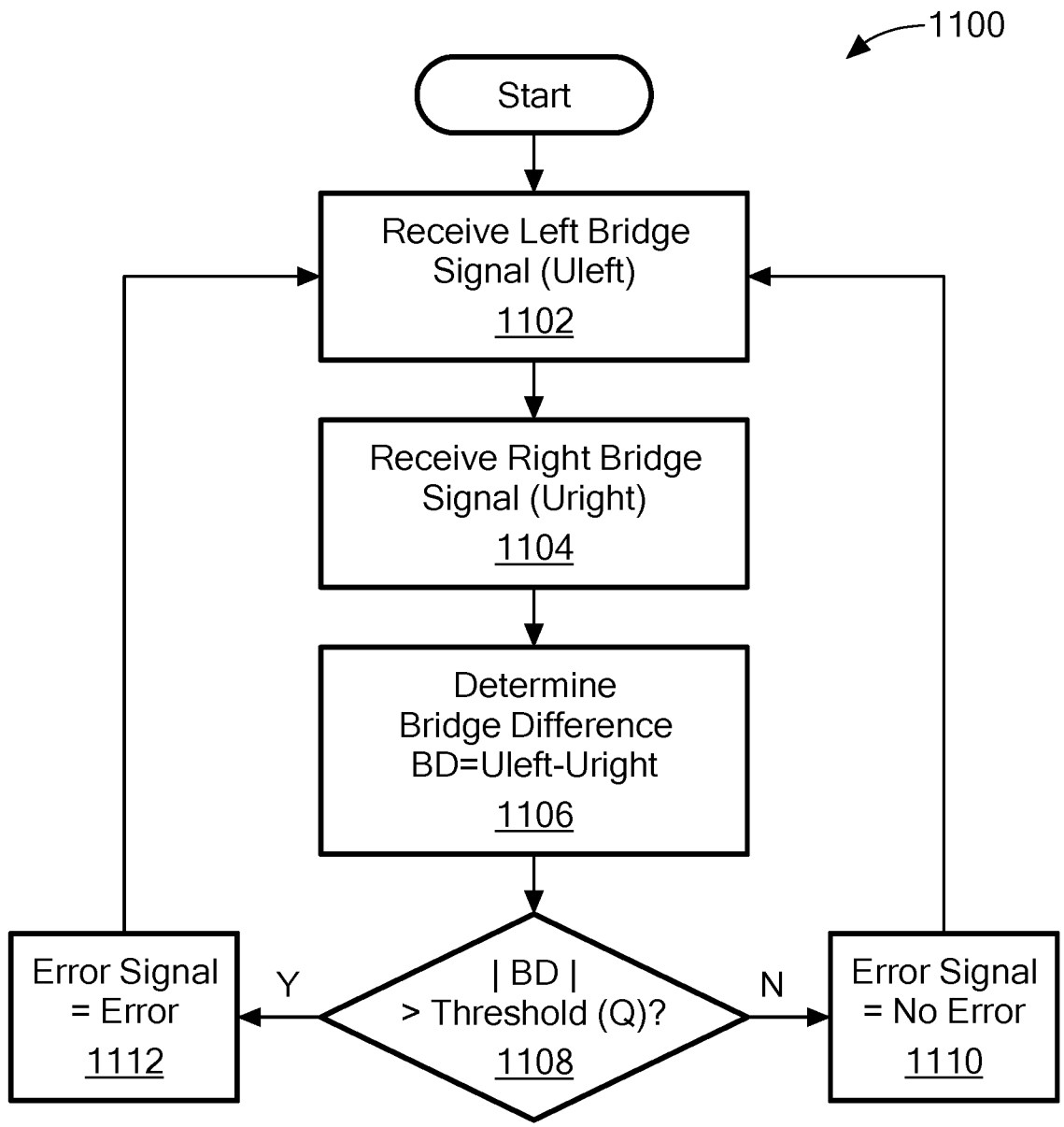
FIG. 11 is a flow chart showing another illustrative method used by the magnetic field sensors of FIGS. 8 and 9.

It should be appreciated that FIGS. 10 and 11 show flowcharts corresponding to the below contemplated technique which would be implemented in magnetic field sensor (FIGS. 8 and 9). Rectangular elements (typified by element 1002 in FIG. 10), herein denoted "processing blocks," represent computer software instructions or groups of instructions. Diamond shaped elements (typified by element 1008 in FIG. 10), herein denoted "decision blocks," represent computer software instructions, or groups of instructions, which affect the execution of the computer software instructions represented by the processing blocks.

Alternatively, the processing and decision blocks represent steps performed by functionally equivalent circuits such as a digital signal processor circuit or an application specific integrated circuit (ASIC). The flow diagrams do not depict the syntax of any particular programming language. Rather, the flow diagrams illustrate the functional information one of ordinary skill in the art requires to fabricate circuits or to generate computer software to perform the processing required of the particular apparatus. It should be noted that many routine program elements, such as initialization of loops and variables and the use of temporary variables are not shown. It will be appreciated by those of ordinary skill in the art that unless otherwise indicated herein, the particular sequence of blocks described is illustrative only and can be varied without departing from the spirit of the invention. Thus, unless otherwise stated the blocks described below are unordered meaning that, when possible, the steps can be performed in any convenient or desirable order.

Referring now to FIG. 10, a method 1000 can be used by the magnetic field sensors 800 and 900 of FIGS. 8 and 9.

At block 1002, one of the bridge separation determination modules 816 or 916 of FIG. 8 or 9 receives a left bridge signal, Uleft, for example, the amplified signal 802a or the amplified signal 902a of FIG. 8 or 9.

At block 1004, the one of the bridge separation determination modules 816 or 916 of FIG. 8 or 9 receives a right bridge signal, Uright, for example, the amplified signal 804a or the amplified signal 904a of FIG. 8 or 9.

At block 1006, the one of the bridge separation determination modules 816 or 916 of FIG. 8 or 9 can determine a bridge ratio, BR, as Uleft/Uright (or Uright/Uright) according to equation (1) above.

At block 1008, one of the function/threshold modules 818 or 918 of FIG. 8 or 9 can use the bridge ratio in a function, f: f=|BR−1| according to equation (2) above and can apply the function to a threshold P, as f>P according to equation (3) above.

At block 1008, if f is greater than P, then the error/no error signal 818a or 918a of FIG. 8 or 9 is set to an error condition at block 1010 and the process returns to block 1002. At block 1008, if f is not greater than P, then the error/no error signal 818a or 918a of FIG. 8 or 9 is set to a no error condition at block 1012 and the process returns to block 1002.

The error condition generated at block 1010 can occur statically, for all rotations of a target object, randomly intermittently as the target object rotates, or periodically as the target object rotates. In all situations, the magnetic field sensors 800 or 900 of FIG. 8 or 9 should not generate the formatted signal 814a or 914a to be indicative of an edge of a passing feature of the target object during the error condition. Thus, false indications of the edges can be avoided.

Referring now to FIG. 11, a method 1100 can be used by the magnetic field sensors 800 and 900 of FIGS. 8 and 9.

At block 1102, one of the bridge separation determination modules 816 or 916 of FIG. 8 or 9 receives a left bridge signal, Uleft, for example, the amplified signal 802a or the amplified signal 902a of FIG. 8 or 9.

At block 1104, the one of the bridge separation determination modules 816 or 916 of FIG. 8 or 9 receives a right bridge signal, Uright, for example, the amplified signal 804a or the amplified signal 904a of FIG. 8 or 9.

At block 1106, the one of the bridge separation determination modules 816 or 916 of FIG. 8 or 9 can determine a bridge difference, BD, as Uleft/−Uright according to equation (4) above.

At block 1108, one of the function/threshold modules 818 or 918 of FIG. 8 or 9 can use the bridge difference in a function, g: g=|BD| according to equation (5) above and can apply the function to a threshold Q, as g<Q according to equation (6) above.

At block 1108, if g is greater than Q, then the error/no error signal 818a or 918a of FIG. 8 or 9 is set to an error condition at block 1110 and the process returns to block 1102. At block 1108, if g is not greater than Q, then the error/no error signal 818a or 918a of FIG. 8 or 9 is set to a no error condition at block 1112 and the process returns to block 1102.

The error condition generated at block 1112 can occur statically, for all rotations of a target object, randomly intermittently as the target object rotates, or periodically as the target object rotates. In all situations, the magnetic field sensors 800 or 900 of FIG. 8 or 9 should not generate the formatted signal 814a or 914a to be indicative of an edge of a passing feature of the target object during the error condition. Thus, false indications of the edges can be avoided.

While two processes are described in conjunction with FIGS. 10 and 11, other processes are possible that can identify a separation between the Uleft and Uright signals.

Figure 12:
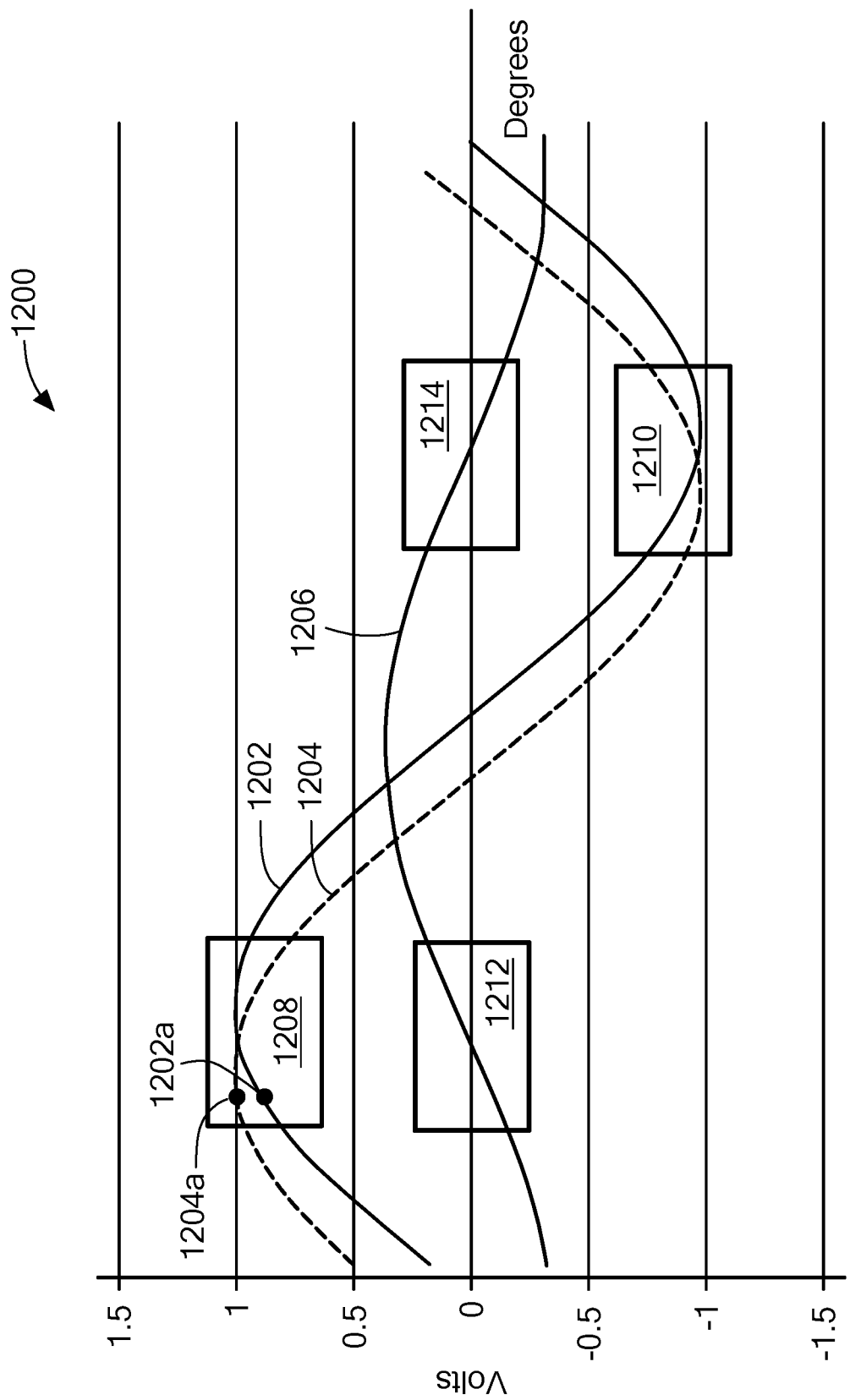
FIG. 12 is a graph showing signals and windows used in the illustrative magnetic field sensors of FIGS. 8 and 9 and showing the methods of FIGS. 10 and 11.

Referring now to FIG. 12, a graph 1200 can have a horizontal axis with a scale in units of angle of rotation of a target object, e.g., 318 of FIG. 6, in arbitrary units and a vertical axis with a scale in voltage in arbitrary units.

A first signal 1202 can be the same as or similar to the Uleft signal 802a, 902a of FIGS. 8 and 9, respectively, when the magnetic field sensor 300 of FIG. 3 is in the presence of the rotating or moving target object 318 of FIG. 3.

A second signal 1204 can be the same as or similar to the Uright signal 804a, 904a of FIGS. 8 and 9, respectively.

Signals 1202, 1204 have a relative phase difference due to the distance 316 between the pairs of magnetoresistance elements 304, 306 and 308, 310.

A signal 1206 is indicative of a difference between the Uleft and Uright signals 1202, 1204, and can be the same as of similar to the signal 806a, 906a of FIGS. 8 and 9, respectively.

Boxes 1208, 1210 are regions of the Uleft and Uright signals 1202, 1204. The regions are indicative of the Uleft signal 1202 and the Uright signal 1204 being within a predetermined distance of each other. See, e.g., equations (3) and (6) above.

Boxes 1212 and 1214 are the same angular width as and align with the boxes 1208, 1210, respectively.

Points 1202a, 1204a are indicative of but one point of the signals 1202, 1203, respectively. Either a ratio of values of the points 1202a, 1204a in accordance with equation (1) or a difference of values of the points 1202a, 1204a in accordance with equation (4) can be used in the processes of FIG. 10 or 11, respectively. Subsequent points (not shown) on the signals 1202, 1204 can be used during the process.

It should be appreciated that, for the purposes of the methods of FIGS. 10 and 11, the bridge signals Uleft and Uright (1202, 1204) are considered separately for detection of the error condition, but the Uleft and Uright signals are combined to generate the signal 1206, combined by the third differential amplifier 806, 906 of FIG. 8 or 9 to generate the two-state comparison signals 820, 920.

As described above in conjunction with FIGS. 8 and 9, comparators within modules 822, 922 can compare the comparison signals 806a, 906a (i.e., signal 1206) with one of more thresholds to generate two-state comparison signals 820, 920. Accordingly, boxes 1212, 1214 are indicative of regions of the signal 1206 at which the comparison signals 820, 920 would normally change state, and at which the error/no error signals 818a, 918a have states indicative of a no error condition. By operation of the bridge separation determination modules 816, 916 and the function/threshold modules 818, 918, and using the process 1000 of FIG. 10 or the process 1100 of FIG. 11, in some embodiments, the comparison signals 820, 920, are not allowed to change state when any of the signals 1202, 1204 reach the condition of Equations (3) or (6). In other words, if there is an error condition that causes the points 1202a, 1204a to be far apart, the error/no error signals 818a, 918a will take a state indicative of the error condition.

Figure 13:
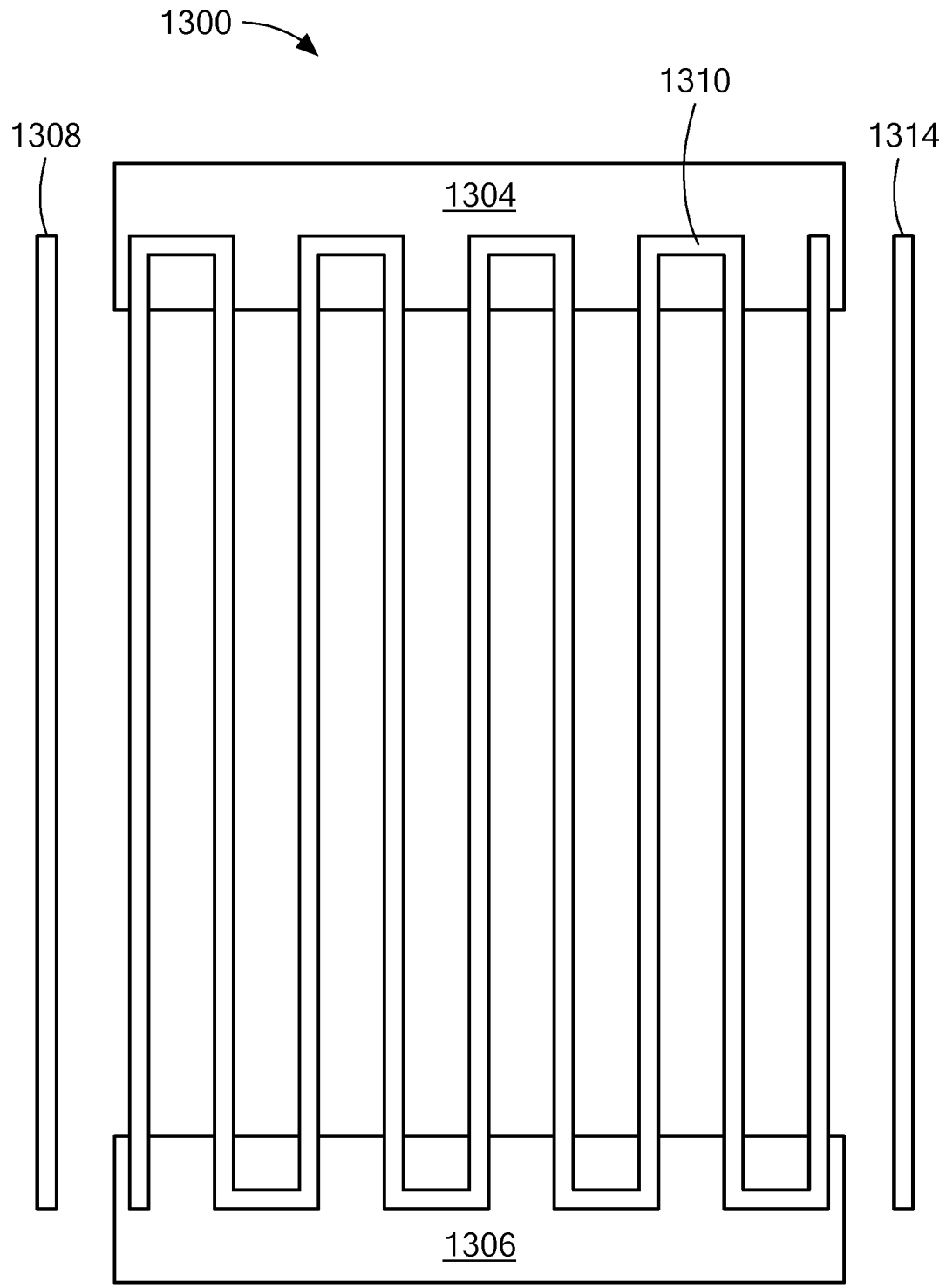
FIG. 13 is a block diagram of a nonresponsive (dummy) magnetoresistance element.
Figure 14:
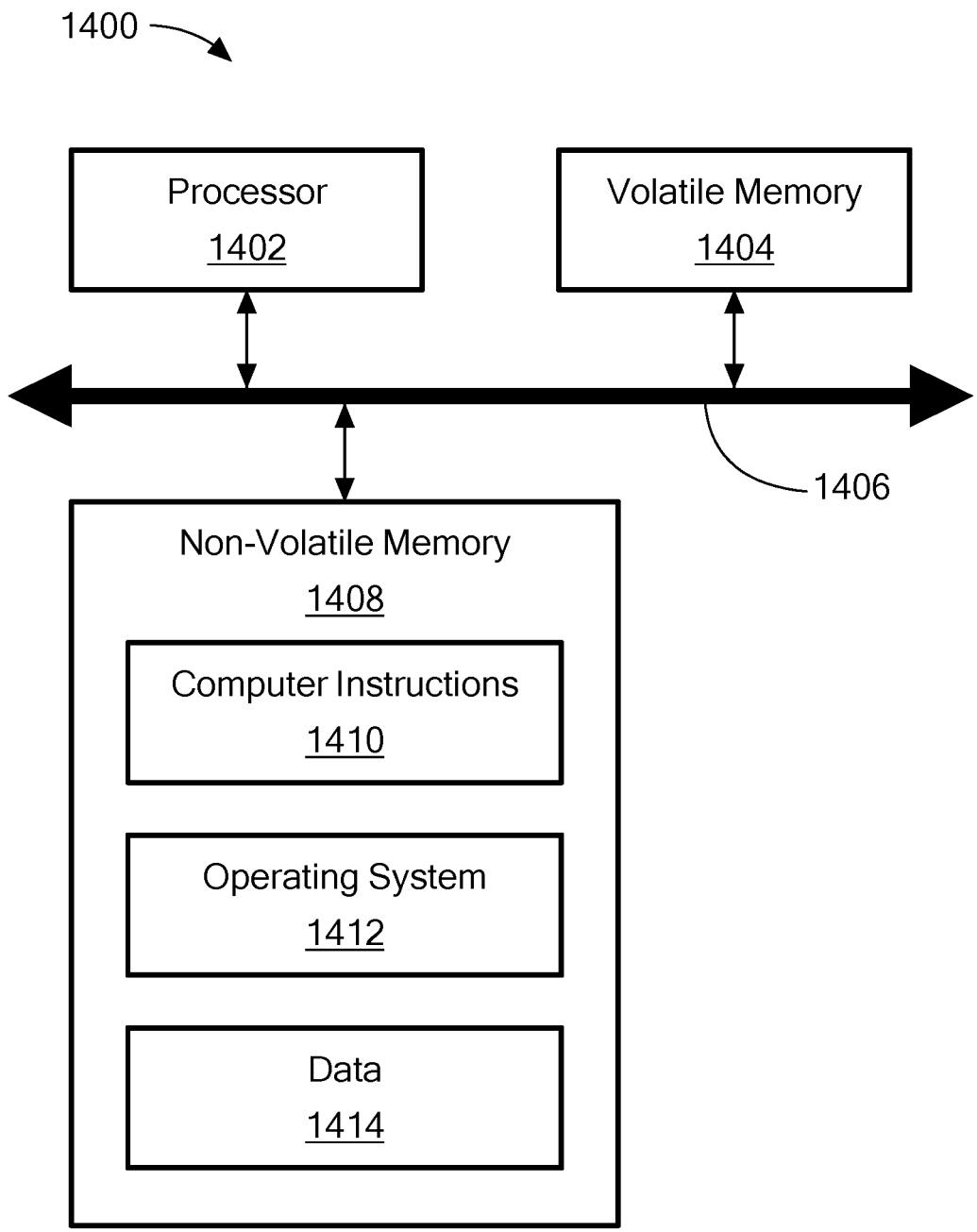
FIG. 14 is a block diagram of a computer that can be used to generate the method of FIG. 10.

Referring now to FIG. 13, and with reference to nonresponsive magnetoresistance elements described above in conjunction with FIG. 4, a nonresponsive magnetoresistance element 1300 can include a plurality of thin strips of magnetoresistance element layers, for example, a strip 1310. The thin strips can be coupled between contacts 1304, 1306 such that driving current flows through all the strips in parallel. The thin strips, which have a higher resistance than a thicker strip used in a conventional GMR element, when coupled in parallel can have a total resistance and temperature coefficient similar to that of a conventional GMR element. However, due to the thin nature of the strips, demagnetizing fields within the thin strips can reduce any sensitivity of the nonresponsive magnetoresistance element 1300, i.e., can reduce an ability for magnetic fields in the free layers of the nonresponsive magnetoresistance element 1300 to rotate in response to an external magnetic field.

In some embodiments, the thin strips each have widths (shortest dimension) less than or equal to one micron in a direction parallel to a substrate on which the thins strips are formed. In other embodiments, the thin strips each have widths less than or equal to five hundred nanometers. In other embodiments, the thin strips each have widths less than or equal to two hundred nanometers.

In some embodiments, the nonresponsive magnetoresistance element 1300 can also include an end strip 1308 and an end strip 1314. The end strips 1308, 1314 can provide better lithography processing of the nonresponsive magnetoresistance element 1300.

The thin strips can be difficult to reliably manufacture with extended lengths. Thus, in some embodiments, a plurality of the nonresponsive magnetoresistance elements 1300, each with a plurality of thin strips, can be coupled in series to achieve a desired total resistance approximately equal to a resistance of the active magnetoresistance elements used together in a bridge, e.g., the bridges 500a, 500b of FIG. 5

As described above in conjunction with FIG. 4, other techniques and other structures can be used to generate a nonresponsive magnetoresistance element.

Referring now to FIG. 13, an illustrative computer system 1300 can include a computer bus 1306. A processor 1302 and a volatile memory 1304 can be coupled to the computer bus 1306. A nonvolatile memory 1308, for example, a hard drive or an EEPROM, can include computer instructions 1310, an operating system 1312, and a data memory 1314, each coupled to the computer bus 1306.

In some embodiments of the above magnetic field sensors 800, 900 of FIGS. 8 and 9, parts of the magnetic field sensors, for example, the bridge separation determination modules 816, 916 and/or the function/threshold modules 818, 918 can be stored within software instructions in the computer instructions 1312.

All references cited herein are hereby incorporated herein by reference in their entirety.

Having described preferred embodiments of the invention it will now become apparent to those of ordinary skill in the art that other embodiments incorporating these concepts may be used. Additionally, the software included as part of the invention may be embodied in a computer program product that includes a computer-readable storage medium. For example, such a computer-readable storage medium can include a computer-readable memory device, such as a hard drive device, a RAM, a ROM, a CD-ROM, a DVD-ROM, or a computer diskette, having computer-readable program code segments stored thereon. The term computer-readable storage medium does not include a transitory signal. As used herein, the term "non-transitory" does not exclude computer readable storage media in which data may be temporarily stored. In contrast, a computer-readable transmission medium can include a communications link, either optical, wired, or wireless, having program code segments carried thereon as digital or analog signals. Accordingly, it is submitted that the invention should not be limited to the described embodiments but rather should be limited only by the spirit and scope of the appended claims. All publications and references cited herein are expressly incorporated herein by reference in their entirety.

Elements of embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method of determining an error condition in a magnetic field sensor, comprising:
   receiving a first bridge signal, the first bridge signal generated by a first full bridge circuit;
   receiving a second bridge signal, the second bridge signal generated by a second full bridge circuit;
   determining a bridge separation from the first bridge signal and the second bridge signal, wherein the determining the bridge separation comprises dividing the first bridge signal by the second bridge signal or dividing the second bridge signal by the first bridge signal;
   comparing a function of the bridge separation to a threshold value; and
   generating an error signal indicative of the error condition or not indicative of the error condition in response to the comparing.

2. The method of claim 1, further comprising:
   generating an output signal having a first signal characteristic in response to the error signal being indicative of the error condition;
   generating the output signal having a second signal characteristic different than the first signal characteristic in response to the error signal being not indicative of the error condition; and
   communicating the output signal to a pin on the magnetic field sensor.

3. The method of claim 1, wherein the first full bridge circuit comprises:
   a first two magnetoresistance elements responsive to a first magnetic field, and
   a first two dummy magnetoresistance elements substantially less responsive or not responsive to the first magnetic field.

4. The method of claim 3, wherein the first two magnetoresistance elements comprises a first two giant magnetoresistance (GMR) elements.

5. The method of claim 3, wherein the second full bridge circuit comprises:
   a second two magnetoresistance elements responsive to a second magnetic field, and
   a second two dummy magnetoresistance elements substantially less responsive or not responsive to the second magnetic field.

6. The method of claim 5, wherein the second two magnetoresistance elements comprises a second two giant magnetoresistance (GMR) elements.

7. The method of claim 5, wherein the first two dummy magnetoresistance elements and the second two dummy magnetoresistance elements are each comprised of a plurality of thin strips of magnetoresistance element layers coupled in parallel, each one of the plurality of thin strips having a shortest dimension parallel to a substrate of less than five hundred nanometers.

8. The method of claim 5, further comprising:
generating an output signal having a first signal characteristic in response to the error signal being indicative of the error condition;
generating the output signal having a second signal characteristic different than the first signal characteristic in response to the error signal being not indicative of the error condition; and
communicating the output signal to outside of the magnetic field sensor.

9. The method of claim 5, wherein the first two dummy magnetoresistance elements and the second two dummy magnetoresistance elements are each comprised of a plurality of thin strips of magnetoresistance element layers coupled in parallel, each one of the plurality of thin strips having a shortest dimension parallel to a substrate of less than two hundred nanometers.

10. The method of claim 5, wherein the first two dummy magnetoresistance elements and the second two dummy magnetoresistance elements are each comprised of a plurality of thin strips of magnetoresistance element layers coupled in parallel, each one of the plurality of thin strips having a shortest dimension parallel to a substrate of less one micron.

11. The method of claim 3, wherein the first two magnetoresistance elements comprises a first two tunneling magnetoresistance (TMR) elements.

12. The method of claim 1, wherein the comparing the function of the bridge separation to the threshold value comprises:
generating the error signal with a first state in response to an absolute value of the bridge separation minus one being greater than the threshold value; and
generating the error signal with a second state different than the first state in response to the absolute value of the bridge separation minus one being less than or equal to the threshold value.

13. The method of claim 12, further comprising:
generating an output signal having a first signal characteristic in response to the error signal being indicative of the error condition;
generating the output signal having a second signal characteristic different than the first signal characteristic in response to the error signal being not indicative of the error condition; and
communicating the output signal to outside of the magnetic field sensor.

14. A magnetic field sensor, comprising:
one or more circuit modules configured to:
receive a first bridge signal, the first bridge signal generated by a first full bridge circuit;
receive a second bridge signal, the second bridge signal generated by a second full bridge circuit;
determine a bridge separation from the first bridge signal and the second bridge signal, wherein the bridge separation comprises a ratio of the first bridge signal and the second bridge signal;
compare a function of the bridge separation to a threshold value; and
generate an error signal indicative or an error condition or indicative of no error condition in response to the comparing.

15. The magnetic field sensor of claim 14, wherein the one or more circuit modules are further configured to
generate an output signal having a first signal characteristic in response to the error signal being indicative of the error condition;
generating the output signal having a second signal characteristic different than the first signal characteristic in response to the error signal being not indicative of the error condition; and
communicate the output signal to a pin on the magnetic field sensor.

16. The magnetic field sensor of claim 14, wherein the first full bridge circuit comprises:
a first two magnetoresistance elements responsive to a first magnetic field, and
a first two dummy magnetoresistance elements substantially less responsive or not responsive to the first magnetic field.

17. The magnetic field sensor of claim 16, wherein the first two magnetoresistance elements comprises a first two giant magnetoresistance (GMR) elements.

18. The magnetic field sensor of claim 16, wherein the second full bridge circuit comprises:
a second two magnetoresistance elements responsive to a second magnetic field, and
a second two dummy magnetoresistance elements substantially less responsive or not responsive to the second magnetic field.

19. The magnetic field sensor of claim 18, wherein the second two magnetoresistance elements comprises a second two giant magnetoresistance (GMR) elements.

20. The magnetic field sensor of claim 18, wherein the first two dummy magnetoresistance elements and the second two dummy magnetoresistance elements are each comprised of a plurality of thin strips of magnetoresistance element layers coupled in parallel, each one of the plurality of thin strips having a shortest dimension parallel to a substrate of less than five hundred nanometers.

21. The magnetic field sensor of claim 18, wherein the one or more circuit modules are further configured to:
generate an output signal having a first signal characteristic in response to the error signal being indicative of the error condition;
generate the output signal having a second signal characteristic different than the first signal characteristic in response to the error signal being not indicative of the error condition; and
communicate the output signal to a pin on the magnetic field sensor.

22. The magnetic field sensor of claim 18, wherein the first two dummy magnetoresistance elements and the second two dummy magnetoresistance elements are each comprised of a plurality of thin strips of magnetoresistance element layers coupled in parallel, each one of the plurality of thin strips having a shortest dimension parallel to a substrate of less than two hundred nanometers.

23. The magnetic field sensor of claim 18, wherein the first two dummy magnetoresistance elements and the second two dummy magnetoresistance elements are each comprised of a plurality of thin strips of magnetoresistance element layers coupled in parallel, each one of the plurality of thin strips having a shortest dimension parallel to a substrate of less than one micron.

24. The magnetic field sensor of claim 16, wherein the first two magnetoresistance elements comprises a first two tunneling magnetoresistance (TMR) elements.

25. The magnetic field sensor of claim 14, wherein the one or more circuit modules are further configured to:
generate the error signal with a first state in response to an absolute value of the bridge separation minus one being greater than the threshold value; and
generate the error signal with a second state different than the first state in response to the absolute value of the bridge separation minus one being less than or equal to the threshold value.

26. The magnetic field sensor of claim 25, wherein the one or more circuit modules are further configured to:
generate an output signal having a first signal characteristic in response to the error signal being indicative of the error condition;
generate the output signal having a second signal characteristic different than the first signal characteristic in response to the error signal being not indicative of the error condition; and
communicate the output signal to a pin on the magnetic field sensor.

27. A magnetic field sensor, comprising:
means for receiving a first bridge signal, the first bridge signal generated by a first full bridge circuit;
means for receiving a second bridge signal, the second bridge signal generated by a second full bridge circuit;
means for determining a bridge separation from the first bridge signal and the second bridge signal, wherein the means for determining the bridge separation comprises means for dividing the first bridge signal by the second bridge signal or dividing the second bridge signal by the first bridge signal;
means for comparing a function of the bridge separation to a threshold value; and
means for generating an error signal indicative or an error condition or indicative of no error condition in response to the comparing.

28. The magnetic field sensor of claim 27, further comprising:
means for generating an output signal having a first signal characteristic in response to the error signal being indicative of the error condition;
means for generating the output signal having a second signal characteristic different than the first signal characteristic in response to the error signal being not indicative of the error condition; and
communicating the output signal to a pin on the magnetic field sensor.

29. The magnetic field sensor of claim 27, wherein the first full bridge circuit comprises:
a first two magnetoresistance elements responsive to a first magnetic field, and
a first two dummy magnetoresistance elements substantially less responsive or not responsive to the first magnetic field.

30. The magnetic field sensor of claim 29, wherein the first two magnetoresistance elements comprises a first two giant magnetoresistance (GMR) elements.

31. The magnetic field sensor of claim 29, wherein the second full bridge circuit comprises:
a second two magnetoresistance elements responsive to a second magnetic field, and
a second two dummy magnetoresistance elements substantially less responsive or not responsive to the second magnetic field.

32. The magnetic field sensor of claim 31, wherein the second two magnetoresistance elements comprises a second two giant magnetoresistance (GMR) elements.

33. The magnetic field sensor of claim 31, wherein the first two dummy magnetoresistance elements and the second two dummy magnetoresistance elements are each comprised of a plurality of thin strips of magnetoresistance element layers coupled in parallel, each one of the plurality of thin strips having a shortest dimension parallel to a substrate of less than five hundred nanometers.

34. The magnetic field sensor of claim 31, further comprising:
means for generating an output signal having a first signal characteristic in response to the error signal being indicative of the error condition;
means for generating the output signal having a second signal characteristic different than the first signal characteristic in response to the error signal being not indicative of the error condition; and
means for communicating the output signal to outside of the magnetic field sensor.

35. The magnetic field sensor of claim 31, wherein the first two dummy magnetoresistance elements and the second two dummy magnetoresistance elements are each comprised of a plurality of thin strips of magnetoresistance element layers coupled in parallel, each one of the plurality of thin strips having a shortest dimension parallel to a substrate of less than two hundred nanometers.

36. The magnetic field sensor of claim 31, wherein the first two dummy magnetoresistance elements and the second two dummy magnetoresistance elements are each comprised of a plurality of thin strips of magnetoresistance element layers coupled in parallel, each one of the plurality of thin strips having a shortest dimension parallel to a substrate of less than one micron.

37. The magnetic field sensor of claim 29, wherein the first two magnetoresistance elements comprises a first two tunneling magnetoresistance (TMR) elements.

38. The magnetic field sensor of claim 27, wherein the means for comparing the function of the bridge separation to the threshold value comprises:
means for generating the error signal with a first state in response to an absolute value of the bridge separation minus one being greater than the threshold value; and
means for generating the error signal with a second state different than the first state in response to the absolute value of the bridge separation minus one being less than or equal to the threshold value.

39. The magnetic field sensor of claim 38, further comprising:
means for generating an output signal having a first signal characteristic in response to the error signal being indicative of the error condition;
means for generating the output signal having a second signal characteristic different than the first signal characteristic in response to the error signal being not indicative of the error condition; and
means for communicating the output signal to outside of the magnetic field sensor.

40. A non-transitory machine-readable storage medium for storing executable instructions in a magnetic field sensor, the instructions comprising instructions for:
receiving a first bridge signal, the first bridge signal generated by a first full bridge circuit;
receiving a second bridge signal, the second bridge signal generated by a second full bridge circuit;

determining a bridge separation from the first bridge signal and the second bridge signal, wherein the bridge separation comprises a ratio of the first bridge signal and the second bridge signal;

comparing a function of the bridge separation to a threshold value; and generating an error signal indicative or an error or indicative of no error in response to the comparing.

41. The non-transitory machine-readable storage medium of claim 40, wherein the instructions further comprise instructions for:

generating the error signal with a first state in response to an absolute value of the bridge separation minus one being greater than the threshold value; and generating the error signal with a second state different than the first state in response to the absolute value of the bridge separation minus one being less than or equal to the threshold value.

* * * * *

UNITED STATES PATENT AND TRADEMARK OFFICE
CERTIFICATE OF CORRECTION

| | |
|---|---|
| PATENT NO. | : 10,921,373 B2 |
| APPLICATION NO. | : 15/825879 |
| DATED | : February 16, 2021 |
| INVENTOR(S) | : Rémy Lassalle-Balier et al. |

It is certified that error appears in the above-identified patent and that said Letters Patent is hereby corrected as shown below:

On the Title Page

(71) Applicant: delete "Worcester, MA (US)" and replace with --Manchester, NH (US)--.

In the Specification

Column 1, Line 46 delete "magnetoresistances element" and replace with --magnetoresistance elements--.

Column 2, Line 11 delete "and output" and replace with --an output--.

Column 2, Line 66 delete "indicative or" and replace with --indicative of--.

Column 3, Line 13 delete "indicative or" and replace with --indicative of--.

Column 3, Line 29 delete "indicative or" and replace with --indicative of--.

Column 3, Line 49 delete "coupled two" and replace with --coupled in two--.

Column 5, Lines 33-34 delete "value above" and replace with --value being above--.

Column 5, Line 47 delete "as" and replace with --is--.

Column 6, Line 57 delete "and arrow 118" and replace with --an arrow 118--.

Column 8, Line 66 delete "generate" and replace with --generated--.

Column 9, Line 25 delete "signal; 602α." and replace with --signal 602α--.

Column 10, Line 28 delete "can be can be" and replace with --can be--.

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 10,921,373 B2

Column 12, Line 19 delete "can be can be" and replace with --can be--.

Column 12, Line 46 delete "in magnetic" and replace with --in a magnetic--.

Column 14, Line 27 delete "of similar" and replace with --or similar--.

Column 14, Line 53 delete "of more" and replace with --or more--.

In the Claims

Column 17, Line 31 Claim 10: delete "less one" and replace with --less than one--.

Column 18, Line 1 Claim 14: delete "indicative or" and replace with --indicative of--.

Column 18, Line 5 Claim 15: delete "configured to" and replace with --configured to:--.

Column 19, Line 37 Claim 27: delete "indicative or" and replace with --indicative of--.

Column 21, Line 7 Claim 40: delete "indicative or" and replace with --indicative of--.